(12) United States Patent
Ando

(10) Patent No.: US 9,425,435 B2
(45) Date of Patent: Aug. 23, 2016

(54) DISPLAY DEVICE, MANUFACTURING METHOD OF DISPLAY DEVICE, AND ELECTRONIC APPARATUS

(71) Applicant: Sony Corporation, Tokyo (JP)

(72) Inventor: Makoto Ando, Tokyo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/400,235

(22) PCT Filed: May 31, 2013

(86) PCT No.: PCT/JP2013/003463
§ 371 (c)(1),
(2) Date: Nov. 10, 2014

(87) PCT Pub. No.: WO2014/020811
PCT Pub. Date: Feb. 6, 2014

(65) Prior Publication Data
US 2015/0108446 A1  Apr. 23, 2015

(30) Foreign Application Priority Data

Jul. 30, 2012  (JP) .................................. 2012-168111

(51) Int. Cl.
*H01L 51/52* (2006.01)
*H01L 27/32* (2006.01)
(Continued)

(52) U.S. Cl.
CPC .............. *H01L 51/56* (2013.01); *H01L 27/322* (2013.01); *H01L 27/3211* (2013.01); *H01L 27/3216* (2013.01); *H01L 27/3218* (2013.01);
(Continued)

(58) Field of Classification Search
CPC ............ H01L 27/3211; H01L 27/3218; H01L 27/322; H01L 27/3216; H01L 2251/558
See application file for complete search history.

(56) References Cited

U.S. PATENT DOCUMENTS

| 8,957,412 B2 * | 2/2015 | Yamada | H01L 51/5265 257/40 |
| 2005/0040756 A1 * | 2/2005 | Winters | H01L 27/3213 313/504 |

(Continued)

FOREIGN PATENT DOCUMENTS

| CN | 1465209 | 12/2003 |
| CN | 101111108 | 1/2008 |

(Continued)

OTHER PUBLICATIONS

International Search Report issued in connection with International Patent Application No. PCT/JP2013/003463, dated Aug. 30, 2013. (5 pages).

(Continued)

*Primary Examiner* — Marvin Payen
*Assistant Examiner* — Jeremy Joy
(74) *Attorney, Agent, or Firm* — K&L Gates LLP

(57) ABSTRACT

There is provided a display device (100) including a step forming member (14) which forms a step between a first region (s1) and a second region (s2) over a substrate (11) so that the first region (s1, 173R) becomes higher than the second region (s2, 173G) when viewed from the substrate (11), a first light emitting (173R) layer transferred to the first region, and a second light emitting layer (173G) transferred to the first region and the second region, and which has an emission wavelength shorter than an emission wavelength of the first light emitting layer.

20 Claims, 15 Drawing Sheets

(51) Int. Cl.
   *H01L 51/56* (2006.01)
   *H01L 51/00* (2006.01)
(52) U.S. Cl.
   CPC ........ *H01L51/0002* (2013.01); *H01L 51/5265* (2013.01); *H01L 2251/558* (2013.01)

(56) References Cited

U.S. PATENT DOCUMENTS

| | | | |
|---|---|---|---|
| 2005/0089629 A1 | 4/2005 | Nishimura et al. | |
| 2005/0225232 A1* | 10/2005 | Boroson | H01L 51/5265 313/504 |
| 2005/0249972 A1* | 11/2005 | Hatwar | H01L 51/5265 428/690 |
| 2005/0258741 A1* | 11/2005 | Kim | H01L 27/3246 313/503 |
| 2005/0280008 A1* | 12/2005 | Ricks | C09K 11/06 257/79 |
| 2006/0138945 A1* | 6/2006 | Wolk | H01L 27/3211 313/506 |
| 2007/0046180 A1* | 3/2007 | Kao | H01L 51/5265 313/504 |
| 2007/0057264 A1* | 3/2007 | Matsuda | H01L 27/3211 257/88 |
| 2007/0075310 A1 | 4/2007 | Lee | |
| 2007/0102737 A1* | 5/2007 | Kashiwabara | H01L 27/3211 257/291 |
| 2007/0216289 A1* | 9/2007 | Kuma | H01L 51/5265 313/504 |
| 2008/0018239 A1* | 1/2008 | Matsuda | C09K 11/06 313/504 |
| 2008/0111474 A1* | 5/2008 | Sung | H01L 27/322 313/504 |
| 2009/0085478 A1* | 4/2009 | Cok | H01L 27/3211 313/506 |
| 2009/0212696 A1 | 8/2009 | Terao | |
| 2009/0305445 A1* | 12/2009 | Ikeda | H01L 51/0013 438/29 |
| 2010/0052524 A1* | 3/2010 | Kinoshita | H01L 51/5265 313/504 |
| 2010/0053044 A1* | 3/2010 | Lee | H01L 51/5259 345/80 |
| 2010/0133994 A1* | 6/2010 | Song | H01L 27/3211 313/504 |
| 2011/0062475 A1 | 3/2011 | Cho | |
| 2011/0303903 A1* | 12/2011 | Yoshinaga | H01L 51/0056 257/40 |
| 2012/0025192 A1 | 2/2012 | Shimizu et al. | |
| 2012/0032207 A1* | 2/2012 | Nishiyama | H01L 27/3248 257/89 |
| 2012/0091439 A1* | 4/2012 | Nishiyama | H01L 27/3216 257/40 |
| 2012/0181921 A1 | 7/2012 | Ono | |
| 2013/0001531 A1* | 1/2013 | Park | H01L 27/3211 257/40 |
| 2013/0187132 A1* | 7/2013 | Ando | H01L 51/0004 257/40 |
| 2014/0284566 A1* | 9/2014 | Yoo | H01L 51/5012 257/40 |

FOREIGN PATENT DOCUMENTS

| | | |
|---|---|---|
| CN | 101661951 | 3/2010 |
| CN | 102024844 A | 4/2011 |
| EP | 1 401 245 | 3/2004 |
| EP | 2159843 | 3/2010 |
| JP | 2007080906 | 3/2007 |
| JP | 2010056017 | 3/2010 |
| JP | 2010-158799 | 7/2010 |
| JP | 2011065992 | 3/2011 |
| JP | 2011076769 | 4/2011 |
| JP | 2011165621 | 8/2011 |
| TW | 200947700 | 11/2009 |
| WO | 2005/101541 | 10/2005 |
| WO | 2009079327 | 6/2009 |
| WO | WO2012017500 | 2/2012 |

OTHER PUBLICATIONS

Written Opinion issued in connection with International Patent Application No. PCT/JP2013/003463,dated Aug. 30, 2013. (6 pages).

Office Action issued in connection with Taiwan Patent Application No. 102120952, dated Jul. 23, 2015. (12 pages).

Office Action issued in CN Application 201380021057.3 mailed Nov. 27, 2015 (25 pages).

Office Action issued in JP Application 2012168111 mailed May 24, 2016, 6 pages.

Office Action issued in CN Application 201380021057.3 mailed Jun. 2, 2016, 21 pages.

* cited by examiner

DISPLAY DEVICE, MANUFACTURING METHOD OF DISPLAY DEVICE, AND ELECTRONIC APPARATUS

CROSS REFERENCES TO RELATED APPLICATIONS

The present application is a national stage of International Application No. PCT/JP2013/003463 filed on May 31, 2013 and claims priority to Japanese Patent Application No. 2012-168111 filed on Jul. 30, 2012, the disclosure of which is incorporated herein by reference.

BACKGROUND

The present disclosure relates to a display device, a manufacturing method of a display device, and an electronic apparatus.

In recent years, forming light emitting layers (organic layers) of an organic EL (Electro Luminescence) display by a printing method has been proposed. A printing method has the advantages of a low process cost compared to that of a vacuum deposition method, and an ease in enlargement of the device.

This printing method is roughly divided into a non-contact system and a contact system. For example, an inkjet method and a nozzle printing method are known as methods of a non-contact system. These methods have the advantages of an ease in enlargement of the device and high material utilization efficiency. However, in these methods, it may be necessary to include a bank (partition) for providing an application position of ink, and there are cases where unevenness in the film thickness occurs within a pixel due to wet spreading of the ink or the like to the bank.

On the other hand, for example, a flexographic printing method, a gravure offset printing method, a reverse offset printing method and the like are known as methods of a contact system. While a flexographic printing method has advantages such as relatively high film thickness accuracy over the substrate, a short time necessary for printing, and a capability of an enlargement of the printer, the accuracy of a plate is low, and it is difficult to correspond to high definition and enlargement of the display device. While it is possible for a gravure offset printing method to have a high accuracy of a plate and to correspond to high definition and enlargement, the thickness distribution within a pixel becomes crest shaped, and there are cases where unevenness will occur in the light emitting luminescence.

Attracting attention within such methods has been a reverse offset printing method. A reverse offset printing method is a method which removes the ink of a non-printing portion by pressure contacting ink uniformly deposited on a transfer body to a plate, and transferring the pattern remaining on the transfer body to the body to be printed as a transfer pattern. In this reverse offset printing method, it is possible to have high definition patterning in addition to a more uniform thickness distribution.

Therefore, it is expected that a reverse offset printing method will be applied not only to the printing of light emitting layers of an organic EL display, but to the entire field of so-called printed electronics. Specifically, for example, applying the reverse offset printing method to the printing of wiring/insulation patterns of printed circuit boards, photoresists used by photolithography steps, color filters for displays, organic layers of organic TFT (Thin Film Transistors) and the like has been considered. An example of technology which uses such a reverse offset printing method is disclosed, for example, in [PTL 1].

CITATION LIST

Patent Literature

PTL 1: JP 2010-158799A

SUMMARY

Technical Problem

However, in a reverse offset printing method using a plate such as described above, since washing of the plate may be necessary to for each time of printing, there is a tendency for the device cost and the process cost to increase. Further, while high definition patterning is possible, it may be necessary in this case to have the transfer body aligned with a high accuracy for the body to be printed, and high definition printing will not necessarily be an easy step.

Accordingly, a new and improved display device, manufacturing method of a display device, and electronic apparatus capable of forming a plurality of light emitting layers without using a plate, in the case where the light emitting layers are formed by a printing method, is proposed in the present disclosure.

Solution to Problem

According to an embodiment of the present disclosure, there is provided a display device including a step forming member which forms a step between a first region and a second region over a substrate so that the first region becomes higher than the second region when viewed from the substrate, a first light emitting layer transferred to the first region, and a second light emitting layer transferred to the first region and the second region, and which has an emission wavelength shorter than an emission wavelength of the first light emitting layer.

According to an embodiment of the present disclosure, there is provided a manufacturing method of a display device, the manufacturing method including transferring a first light emitting layer applied uniformly on a transfer body to a first region over a substrate and preventing the first light emitting layer from adhering to a second region over the substrate by a step formed between the first region and the second region, and transferring a second light emitting layer having an emission wavelength shorter than an emission wavelength of the first light emitting layer to the first region and the second region.

According to an embodiment of the present disclosure, there is provided an electronic apparatus including a display device including a step forming member which forms a step between a first region and a second region over a substrate so that the first region becomes higher than the second region when viewed from the substrate, a first light emitting layer transferred to the first region, and a second light emitting layer transferred to the first region and the second region, and which has an emission wavelength shorter than an emission wavelength of the first light emitting layer.

The first light emitting layer, in which light with a long emission wavelength is more easily emitted, can be prevented from being transferred to the second region, by including the step between the first region and the second region. Therefore, light emission by the second light emitting layer transferred to the second region is not affected by the first light emitting layer. On the other hand, while the second light emitting layer is transferred by being superimposed onto the first light emitting layer transferred to the first region, since light is more easily emitted by the first light emitting layer, it is possible to suppress the influence of the second light emitting layer.

Advantageous Effects of Invention

According to the present disclosure as described above, a plurality of light emitting layers can be formed without using a plate, in the case where light emitting layers are formed by a printing method.

Additional features and advantages are described herein, and will be apparent from the following Detailed Description and the figures.

DETAILED DESCRIPTION

Figure 1:
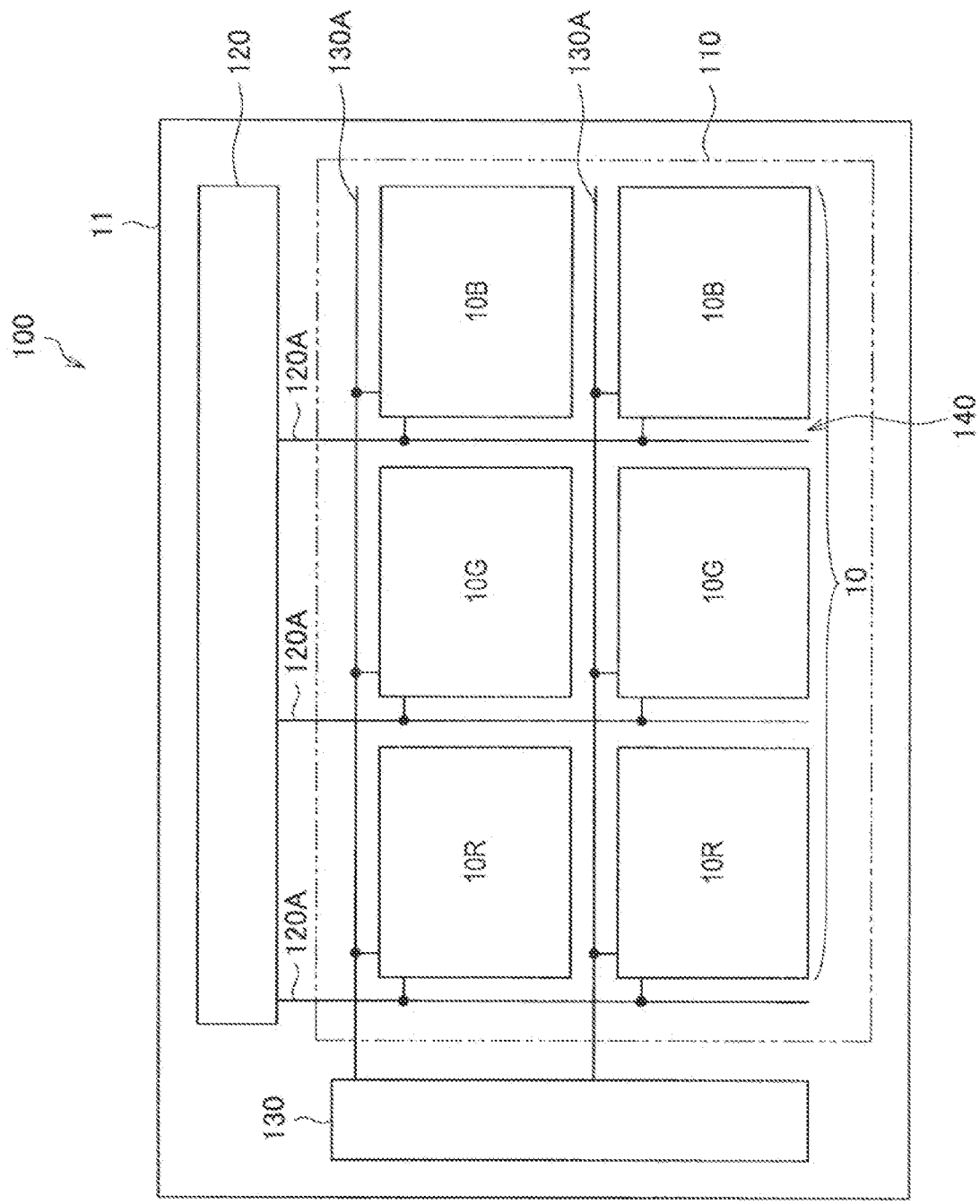
FIG. 1 is a figure which shows an example of the overall configuration of a display device according to a first embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be given in the following order.

Figure 2:
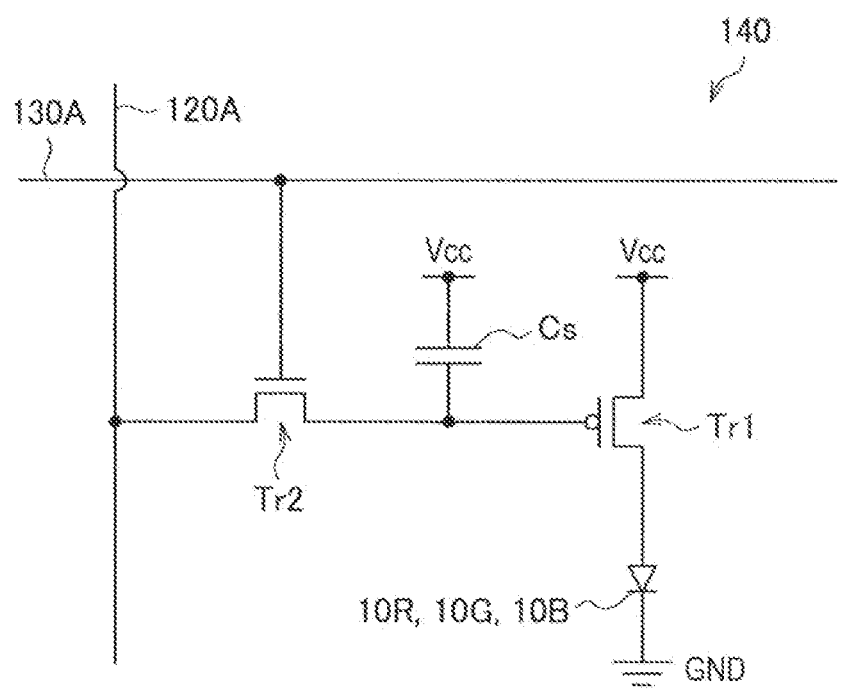
FIG. 2 is a figure which shows a configuration example of a pixel driving circuit of the display device according to the first embodiment of the present disclosure.
Figure 3:
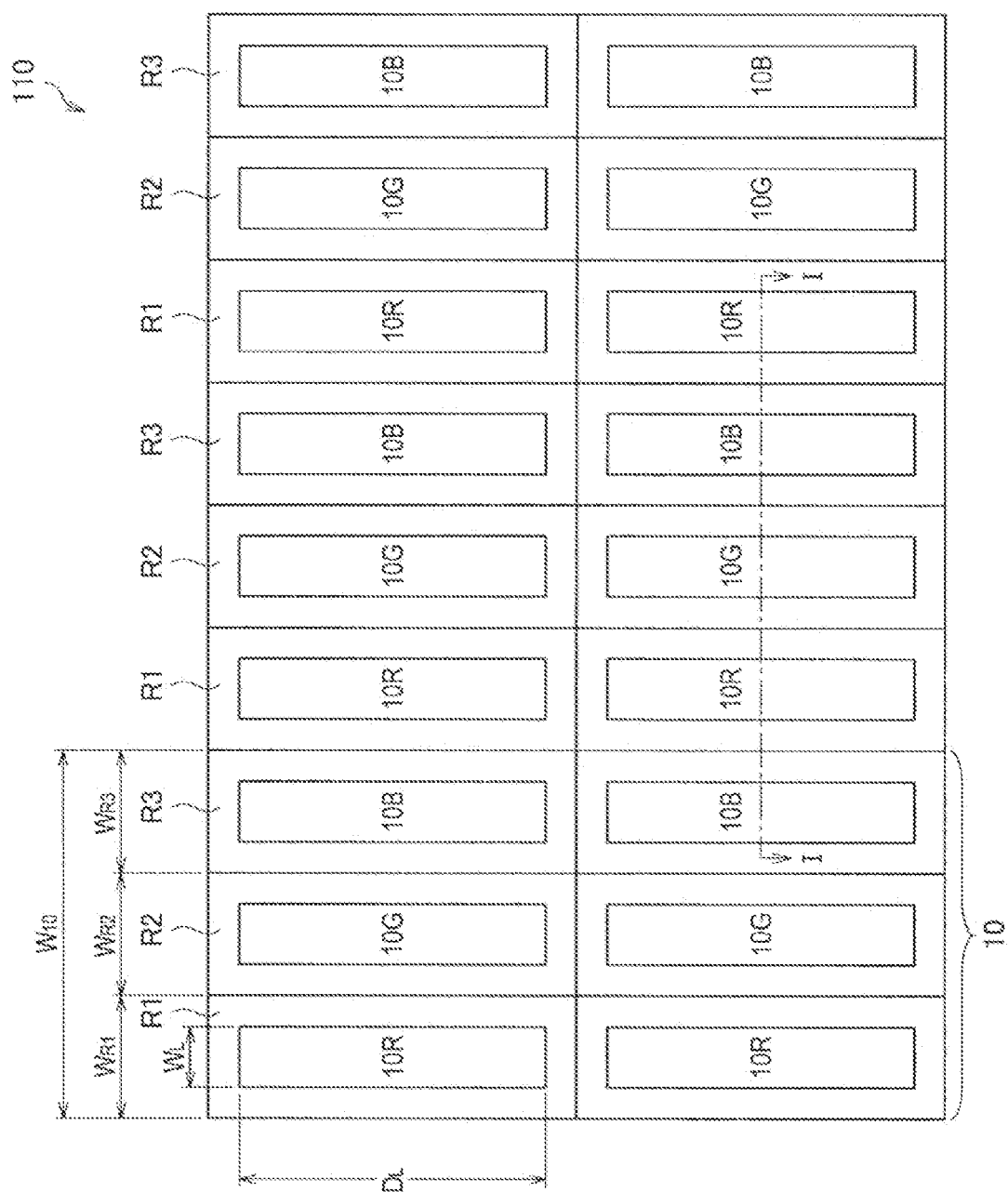
FIG. 3 is a figure which shows an example of a planar configuration for a display region of the display device according to the first embodiment of the present disclosure.
Figure 4:
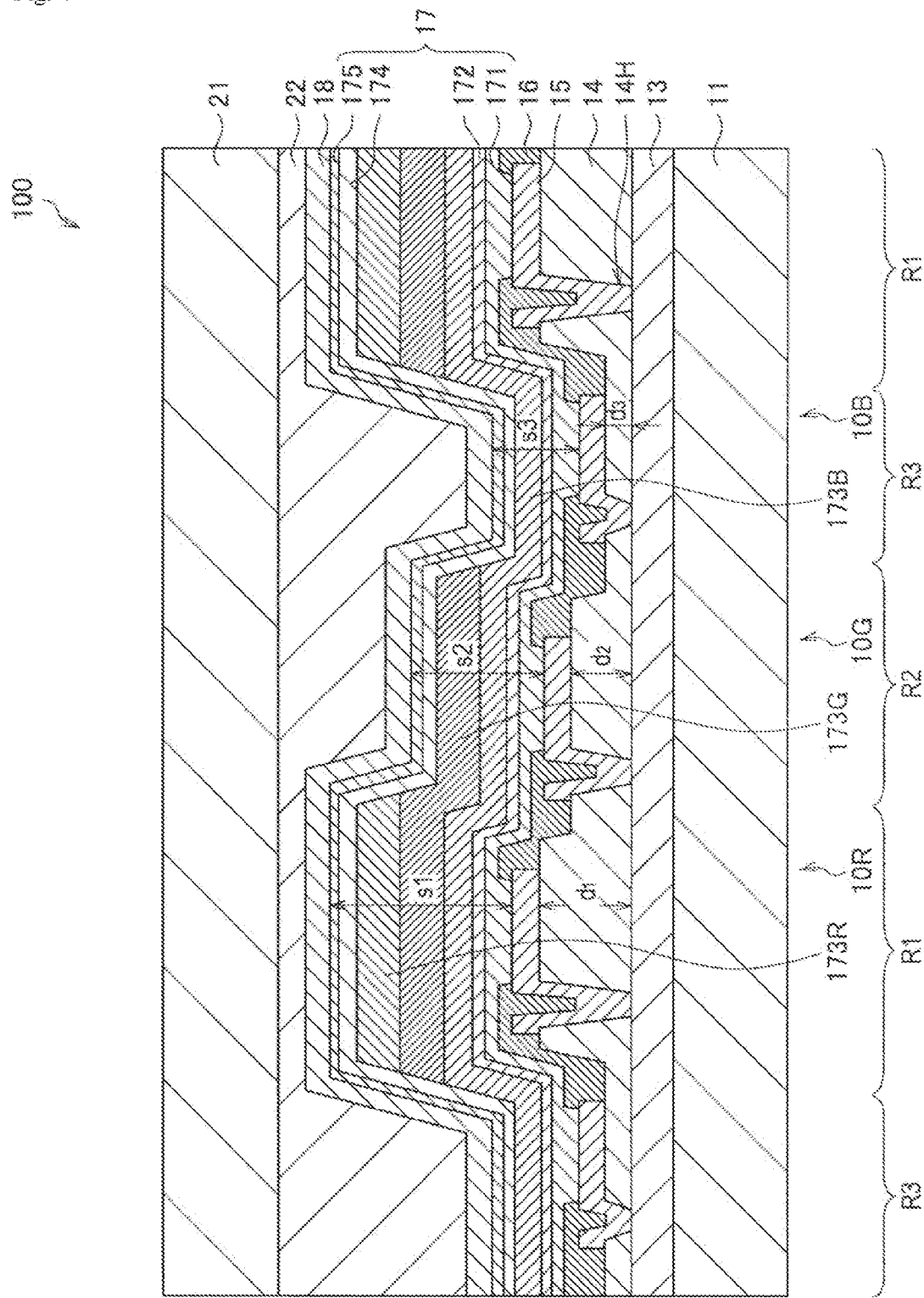
FIG. 4 is an I-I cross section view of FIG. 3.

1. The First Embodiment (Example of transferring red, green and blue light emitting layers, respectively)
   1-1. Configuration of the display device
   1-2. Manufacturing method of the display device
   1-3. Application to an electronic apparatus
   1-4. Modified example
2. The Second Embodiment (Example of setting a blue light emitting layer as a common layer)
   2-1. Configuration of the display device
   2-2. Manufacturing method of the display device
   2-3. Modified example
3. The Third Embodiment (Example of transferring yellow and blue light emitting layers, respectively)
   3-1. Configuration of the display device
   3-2. Modified example
4. Supplement 1. The First Embodiment 1-1. Configuration of the Display Device First, a configuration of a display device according to a first embodiment of the present disclosure will be described with reference to FIGS. 1 to 4. FIGS. 1 and 2 are figures for describing the overall configuration of the display device. FIGS. 3 and 4 are figures for describing a display region of the display device in more detail.

(Overall Configuration)

FIG. 1 is a figure which shows an example of the configuration of the display device according to the first embodiment of the present disclosure. The display device according to the present embodiment is an organic EL display 100.

With reference to FIG. 1, the organic EL display 100 has, over a substrate 11, a display region 110 in which red light emitting elements 10R, green light emitting elements 10G and blue light emitting elements 10B are arranged in a matrix. One pixel 10 is constituted by a group of one red light emitting element 10R, one green light emitting element 10G, and one blue light emitting element 10B. A signal line driving circuit 120 and a scanning line driving circuit 130 are included as drivers for image display in the vicinity of the display region 110.

Further, pixel driving circuits 140 connected to each of the red light emitting elements 10R, green light emitting elements 10G, and blue light emitting elements 10B are included in the display region 110. The configuration of this pixel driving circuit 140 will be further described hereinafter with reference to FIG. 2.

(Configuration of the Pixel Driving Circuit)

FIG. 2 is a figure which shows a configuration example of one pixel driving circuit 140 included in the organic EL display 100. In the present embodiment, the pixel driving circuits 140 are active type driving circuits formed below lower electrodes of the light emitting elements, which are described later.

With reference to FIG. 2, a driving transistor Tr1 and a writing transistor Tr2 are included in the pixel driving circuit 140, and a capacitor Cs is connected between the driving transistor Tr1 and the writing transistor Tr2. A red light emitting element 10R, a green light emitting element 10G, or a blue light emitting element 10B is connected in series to the driving transistor Tr1 between a first power supply line Vcc and a second power supply line GND.

Here, the driving transistors Tr1 and writing transistors Tr2 are generally TFTs (Thin Film Transistors). For example, various structures are used, such as an inverted staggered structure (bottom gate type) or a staggered structure (top gate type), as a TFT structure.

Further, a plurality of signal lines 120A in a column direction and a plurality of scanning lines 130A in a row direction are arranged in the pixel driving circuits 140. Each intersecting point of the signal lines 120A and scanning lines 130A corresponds to either a red light emitting element 10R, a green light emitting element 10G, or a blue light emitting element 10B. Each of the signal lines 120A is connected to the above described signal line driving circuit 120, and the signal line driving circuit 120 supplies image signals to the source electrodes of the writing transistors Tr2 via the signal lines 120A. Similarly, each of the scanning lines 130A is connected to the scanning line driving circuit 130, and the scanning line driving circuit 130 sequentially supplies scanning signals to the gate electrodes of the writing transistors Tr2 via the scanning lines 130A.

(Configuration of the Display Region)

FIG. 3 is a figure which shows an example of a planar configuration for the display region 110 in the organic EL display 100. FIG. 4 is an I-I cross section view of FIG. 3. As shown in FIG. 3, red light emitting elements 10R, green light emitting elements 10G, and blue light emitting elements 10B are arranged in a matrix in the display region 110. A group of one red light emitting element 10R, one green light emitting element 10G, and one blue light emitting element 10B is included in one pixel 10.

As shown in FIG. 4, a TFT layer 13, a flattening insulating film 14, lower electrodes 15, an aperture insulating film 16, organic layers 17, an upper electrode 18, an adhesion layer 22, and a sealing substrate 21 are included over the substrate 11, in this sequence from the substrate 11. From among these, the red light emitting elements 10R, the green light emitting elements 10G, and the blue light emitting elements 10B (hereinafter, there are cases where these are called "light emitting elements") each include the lower electrodes 15, the aperture insulating film 16, the organic layers 17, and the upper electrode 18. Note that the organic EL display 100 is a bottom emission type in which the light of the light emitting elements is extracted from the substrate 11 side.

(Substrate to Flattening Insulating Film)

The substrate 11 is a support medium which has a flat surface. For example, a film, a sheet or the like of quartz, glass, metallic foil, or resin can be used as the substrate 11. In the case where a film or a sheet of resin is used, for example, a methacrylate resin such as polymethyl methacrylate (PMMA), a polyester such as polyethylene terephthalate (PET), polyethylene naphthalate (PEN) or polybutylene naphthalate (PBT), or a polycarbonate resin can be used as this material. In this case, in order to suppress water permeability and gas permeability, it is desirable to perform surface treatment by making the substrate 11 a laminated structure.

The TFT layer 13 is a layer on which the pixel driving circuits 140 described above with reference to FIG. 2 are formed. The driving transistors Tr1 included in the pixel driving circuits 140 are electrically connected to the lower electrodes 15.

The flattening insulating film 14 is included for flattening the surface of the TFT layer 13. Connection holes 14H are formed in the flattening insulating film 14 for connecting the driving transistors Tr1 of the TFT layer 13 with the lower electrodes 15. Therefore, it is desirable for the flattening insulating film 14 to be formed using a material with good pattern accuracy such as, for example, a polyamide-based organic material or an inorganic material such as silicon oxide ($SiO_2$).

In the present embodiment, the thickness d of the flattening insulating film 14 is respectively different for first regions R1, in which red light emitting elements 10R are formed, second regions R2, in which green light emitting elements 10G are formed, and third regions R3, in which blue light emitting elements 10B are formed. More specifically, the thickness d1 of the first regions R1 is greater than the thickness d2 of the second regions R2. Further, the thickness d2 of the second regions R2 is greater than the thickness d3 of the third regions R3.

In this way, steps are formed so that the first regions R1 become higher than the second regions R2, and so that the second regions R2 becomes higher than the third regions R3, when viewed from the substrate 11. That is, in the present embodiment, the flattening insulating film 14 functions as a step forming member. As described later, these steps prevent the red light emitting layer 173R transferred to the first regions R1 from adhering to the second regions R2 and the third regions R3, and also prevent the green light emitting layer 173G transferred to the first regions R1 and the second regions R2 from adhering to the third regions R3.

Here, the size of each of the steps between a first regions R1 and a second regions R2 (d1-d2), and the size of each of the steps between a second regions R2 and a third regions R3 (d2-d3) are arbitrarily set, in accordance with, for example, the material properties of a transfer body used to transfer the light emitting layers, a pressing pressure of the transfer body or the like. As one setting example, the size of the steps (d1-d2) and (d2-d3) are desirably $1/100$ or more of the width of the second regions R2 and the third regions R3, which are the lower part by each of the steps, and further desirably 500 nanometers or more.

The resolution of an organic EL display, which includes from mobile equipment such as a mobile phone to large scale televisions, is generally from 300 ppi to approximately 20 ppi. Therefore, for example, the pitch $W_{10}$ of the pixel 10 shown in FIG. 3 is approximately 84 micrometers to 1270 micrometers. Accordingly, the widths $W_{R1}$, $W_{R2}$, and $W_{R3}$ of the first regions R1, the second regions R2, and the third regions R3 each become approximately 28 micrometers to 420 micrometers. In this case, the size of the steps (d1-d2) and (d2-d3) will be sufficient when they are approximately 1 micrometer to 10 micrometers.

Note that, while not shown in the figures, color filters may be included between the substrate 11 and the flattening insulating film 14. The color filters may include, for example, a red filter, a green filter, and a blue filter. The red filters are arranged in the first regions R1, in which the red light emitting elements 10R are formed, the green filters are arranged in the second regions R2, in which the green light emitting elements 10G are formed, and the blue filters are arranged in the third regions R3, in which the blue light emitting elements 10B are formed. The red filters, the green filters, and the blue filters are each formed, for example, by a resin which includes a pigment. By arbitrarily selecting the pigments, adjustments are possible so that the permeability of light from each of the red, green, and blue wavelengths becomes greater than that of the other wavelengths.

A light shielding film as a black matrix may be included, along with a red filter, a green filter and a blue filter, in the color filters. In this way, the light generated by each light emitting element is extracted, the external light reflected by the wiring components between each of the light emitting elements is absorbed, and the contrast improves. The light shielding film includes, for example, a black colorant, and is formed by a black polymeric film or a black thin film filter with an optical density of one or more. A black polymeric film is relatively inexpensive and can be easily formed. On the other hand, a thin film filter has, for example, at least one layer of a metallic, metallic nitride, or metallic oxide thin film, and attenuates light by using the interference of the thin film. The thin film filter may be formed, for example, by alternately laminating chrome (Cr) and chromium oxide ($Cr_2O_3$).

Note that since light emitting elements are included for each of the colors red, green, and blue in the present embodiment, any or all of a red filter, a green filter, and a blue filter is not necessarily included.

(Light Emitting Elements)

The lower electrodes 15 are anodes of the light emitting elements, and are connected to the driving transistors Tr1 of the TFT layer 13 as described above. One lower electrode 15 is included for each of the light emitting elements, and is formed, for example, using a transparent material of a single metal element, such as chrome (Cr), gold (Au), platinum (Pt), nickel, (Ni), copper (Cu), tungsten (W), or silver (Ag), or of an alloy of these. Or, the lower electrodes 15 may be formed by laminating metallic films and transparent conductive films formed using the above described metallic materials. In this case, for example, alloys or the like, such as indium tin oxide (ITO), indium zinc oxide (InZnO), or zinc oxide (ZnO), may be used as the transparent conductive films.

The aperture insulating film 16 secures insulation between the lower electrodes 15 and the upper electrode 18, and forms apertures for forming the light emitting regions in a desired shape. While the organic layers 17 and the upper electrode 18 included on the aperture insulating film 16 may be formed on the aperture insulating film 16 in the portions other than the apertures, the portions where light is to be emitted are the aperture portions. The aperture insulating film 16 may be formed, for example, by an inorganic insulating material such as a silicon oxide. Or, the aperture insulating film 16 may be formed by laminating a photosensitive resin, such as positive type photosensitive polybenzoxazole or positive type photosensitive polyimide, over the above described inorganic insulating material.

Here, as shown in FIG. 3, the apertures formed by the aperture insulating film 16 corresponding to the light emitting regions of each light emitting element have a width $W_L$ and a length $D_L$. As an example, in the case where the pitch $W_{10}$ of the pixels 10 is 360 micrometers, and the widths $W_{R1}$, $W_{R2}$, and $W_{R3}$ of the first regions R1, the second regions R2, and the third regions R3 are all 120 micrometers, the width $W_L$ may be set to 60 micrometers, and the length $D_L$ may be set to 280 micrometers.

The organic layers 17 each include a hole injection layer (HIL) 171, a hole transport layer (HTL) 172, emitting layers (EML) 173, an electron transport layer (ETL) 174, and an electron injection layer (EIL) 175, in this sequence from the substrate 11. A red light emitting layer 173R which corresponds to the red light emitting elements 10R, a green light emitting layer 173G which corresponds to the green light emitting elements 10G, and a blue light emitting layer 173B which corresponds to the blue light emitting elements 10B, are each included as the light emitting layers 173.

The hole injection layer 171 is included to be shared by each of the light emitting elements. The hole injection layer 171 functions as a buffer layer which improves the hole injection efficiency and prevents leakage of the holes. While the material of the hole injection layer 171 may be selected as appropriate in accordance with the relationship with the materials of the electrodes and the adjoining layers, for example, polyaniline and its derivatives, polythiophene and its derivatives, polypyrrole and its derivatives, polyphenylene and its derivatives, polythienylene vinylene and its derivatives, polyquinoline and its derivatives, polyquinoxaline and its derivatives, a conductive polymer such as a polymer including an aromatic amine structure in a main chain or side chain, a metallophthalocyanine (such as copper phthalocyanine), a carbon or the like may be used. The thickness of the hole injection layer 171 is, for example, approximately 5 nanometers to 100 nanometers, and is more desirable to be approximately 8 nanometers to 50 nanometers.

Here, in the case where the hole injection layer 171 is formed by a polymeric material, the weight average molecular weight (Mw) is, for example, approximately 2,000 to 300,000, and is more desirable to be approximately 5,000 to 200,000. In the case where the Mw is less than 5,000, there is the possibility of dissolving at the time when forming the layers from the hole transport layer 172 onwards. Further, in the case where the Mw exceeds 300,000, there is the possibility that film formation will become difficult due to gelation of the materials. Note that tetrahydrofuran is set as a solvent, and the weight average molecular weight (Mw) is a value which requests a mean molecular weight of polystyrene conversion by GPC (Gel Permeation Chromatography).

In the above described case, the hole injection layer 171 may be formed, for example, by a polymeric material such as polydioxythiophenes, such as polyaniline, oligoaniline, or poly(3,4-ethylenedioxythiophene) (PEDOT). More specifically, trade name Nafion (registered trademark) and trade name Liquion (registered trademark) made by HC Starck, ELsource (registered trademark) made by Nissan Chemical Industries, Ltd., conductive polymer Verazol made by Soken Chemical and Engineering Co., Ltd. or the like may be used as such a material.

Note that while it is desirable, in the case where the lower electrodes 15 are used as anodes of the light emitting elements, to form the lower electrodes 15 by a material with high hole injection characteristics, it is possible for a material with a comparatively small size of a work function such as an aluminum alloy, for example, to be used as anodes by appropriately forming the hole injection layer 171.

The hole transport layer 172 is included to be shared by each of the light emitting elements. The hole transport layer 172 has a function which improves the hole transport efficiency to the light emitting layers 173. A light emitting material soluble in an organic solvent, for example, polyvinyl carbazole and its derivatives, polyfluorene and its derivatives, polyaniline and its derivatives, polysilane and its derivatives, a polysiloxane derivative including an aromatic amine structure in a main chain or side chain, polythiophene and its derivatives, polypyrrole or the like may be used as the material which forms the hole transport layer 172. The thickness of the hole transport layer 172 is, for example, approximately 10 nanometers to 200 nanometers, and is more desirable to be approximately 15 nanometers to 150 nanometers.

Here, in the case where the hole transport layer 172 is formed by a polymeric material, the weight average molecular weight (Mw) is approximately 50,000 to 300,000, and is more desirable to be approximately 100,000 to 200,000. In the case where the Mw is less than 50,000, a dot will occur in the hole injection layer 171 and the hole transport layer 172 by a low molecular element within the polymer material being omitted at the time of forming the light emitting layers 173, and there is the possibility that the initial performance of the light emitting elements will be reduced and cause deterioration of the elements. Further, in the case where the Mw exceeds 300,000, there is the possibility that film formation will become difficult due to gelation of the materials.

The light emitting layers 173, that is, the red light emitting layer 173R, the green light emitting layer 173G, and the blue light emitting layer 173B, emit light by causing a recombination of electrons and holes by applying an electric field. The red light emitting layer 173R is formed in the first regions R1 over the substrate 11. The green light emitting layer 173G is formed in the first regions R1 and the second regions R2 over the substrate 11. The blue light emitting layer 173B is formed in all the first regions R1, the second regions R2, and the third regions R3 over the substrate 11. The red light emitting layer 173R is formed, for example, by a light emitting material having at least one peak wavelength in the range of 620 nanometers to 750 nanometers. The green light emitting layer 173G is formed, for example, by a light emitting material having at least one peak wavelength in the range of 495 nanometers to 570 nanometers. Further, the blue light emitting layer 173B is formed, for example, by a light emitting material having at least one peak wavelength in the range of 450 nanometers to 495 nanometers.

More specifically, the light emitting layers 173 may be formed by a mixed material which adds a low molecular material (monomer or oligomer) to a polymer (light emitting) material. For example, the light emitting layers 173 are formed by doping an organic EL material with a polyfluorene-based polymer derivative, a (poly) paraphenylenevinylene derivative, a polyphenylene derivative, a polyvinyl carbazole derivative, a polythiophene derivative, a perylene-based pigment, a coumarin-based pigment, a rhodamine-based pigment, or the above described polymer material. For example, rubrene, perylene, 9,10-diphenylanthracene, tetraphenyl butadiene, nile red, coumarin 6 or the like may be used as the doping material. The thickness of the light emitting layers 173 are, for example, approximately 10 nanometers to 200 nanometers, and are more desirable to be 15 nanometers to 100 nanometers.

In the present embodiment, the red light emitting layer 173R, the green light emitting layer 173G, and the blue light emitting layer 173B are all applied on a transfer body and then transferred over the substrate 11. In this case, as described above, the red light emitting layer 173R transferred to the first regions R1 is prevented from adhering to the second regions R2 and the third regions R3, and the green light emitting layer 173G transferred to the second regions R2 is prevented from adhering to the third regions R3, by the steps formed by the flattening insulating film 14. Accordingly, each light emitting layer 173 is not affected by color mixing or the like due to adhering by other light emitting layers, in which light with a long emission wavelength is more easily emitted.

On the other hand, the green light emitting layer 173G is also transferred to the first regions R1 as well as on the second regions R2 to be transferred originally. Further, the blue light emitting layer 173B is also transferred to the first regions R1 and the second regions R2 as well as to the third regions R3 to be transferred originally. However, in these cases, since there is a high probability for light to be emitted by the light emitting layer 173 of a long wavelength side with low excited energy levels, light will be more strongly emitted by the red light emitting layer 173R (in the case of the first regions R1) or the green light emitting layer 173G (in the case of the second regions R2) with a longer wavelength, and the influence of the other light emitting layers transferred by being superimposed will be small.

The electron transport layer 174 is included to be shared by each of the light emitting elements. The electron transport layer 174 has a function which improves the electron transport efficiency to the light emitting layer 173. For example, quinoline, perylene, phenanthroline, phenanthrene, pyrene, bisstyryl, pyrazine, triazole, oxazole, fullerene, oxadiazole, fluorenone, anthracene, naphthalene, butadiene, coumarin, acridine, stilbene, their derivatives or metallic complexes, for example, tris(8-hydroxyquinoline)aluminum (Alq3) or the like may be used as the material of the electron transport layer 174.

The electron injection layer 175 is included to be shared by each of the light emitting elements. The electron injection layer 175 has a function which improves the electron injection efficiency. For example, lithium oxide ($Li_2O$) which is an oxide of lithium (Li), cesium carbonate ($Cs_2CO_3$) which is a complex oxide of cesium (Cs), or a mixture of these may be used as the material of the electron injection layer 175. Further, metals with a small work function, such as alkali earth metals such as calcium (Ca) or barium (Ba), alkaline metals such as lithium or cesium, indium (In), or magnesium (Mg) may be used singly or in a mixture. In addition, oxides, complex oxides, or fluorides of these metals may be used singly or in a mixture.

The upper electrode 18 is a cathode of the light emitting elements, and is included over the electron injection layer 175 to be shared by each of the light emitting elements. That is, the upper electrode 18 is a common electrode of the red light emitting elements 10R, the green light emitting elements 10G, and the blue light emitting elements 10B. As described above, the upper electrode 18 and the lower electrodes 15 are insulated. The upper electrode 18 may be formed, for example, by aluminum (Al) with a thickness of 200 nanometers.

In the present embodiment, an interval s between the lower electrodes 15 and the upper electrode 18 in each region is different for each of the first to third regions R1 to R3. More specifically, since the red light emitting layer 173R, the green light emitting layer 173G and the blue light emitting layer 173B are superimposed in the first regions R1, an interval s1 is the largest among all the regions. Since the green light emitting layer 173G and the blue light emitting layer 173B are superimposed in the second regions R2, an interval s2 is the next largest. Since only the blue light emitting layer 173B is formed in the third regions R3, an interval s3 is the smallest among all the regions.

Here, if the intervals s1 to s3 are set, for example, so as to become an integral multiple of the original emission wavelength of the light emitting layers for each region, the strongest light of each color can be extracted by a cavity effect. More specifically, the thickness of the blue light emitting layer 173B may be set in the third regions R3 so that the interval s3 becomes a multiple integral of the emission wavelength of the blue light emitting layer 173B. Further, the thickness of the green light emitting layer 173G superimposed onto the blue light emitting layer 173B may be set in the second regions R2 so that the interval s2 becomes a multiple integral of the emission wavelength of the green light emitting layer 173G. In addition, the thickness of the red light emitting layer 173R superimposed onto the green light emitting layer 173G and the blue light emitting layer 173B may be set in the first regions R1 so that the interval s1 becomes a multiple integral of the emission wavelength of the red light emitting layer 173R.

Note that in the case where the intervals s are set in accordance with emission wavelengths, it may not be necessary to set all the intervals s1 to s3 in accordance with emission wavelengths, and only one of them may be set in accordance with an emission wavelength. Since the number of superimposed light emitting layers in each region is different in the present embodiment, electrode separation corresponding to the original emission wavelength of the light emitting layers for each region is set, and it is possible to achieve a cavity effect for each color.

(Adhesion Layer and Sealing Substrate)

An adhesion layer 22, such as a thermosetting resin or an ultraviolet curing resin, is formed over the upper electrode 18, and a sealing substrate 21 such as glass is bonded onto the adhesion layer 22. As described above, while the organic EL display 100 is a bottom emission type, it is also possible for this to be set as a top emission type. In this case, a color filter substrate may be used as the sealing substrate 21.

Note that, while not shown in the figures, a protective layer may be included to be shared by each of the light emitting elements between the upper electrode 18 and the adhesion layer 22. For example, the protective layer may be formed by an inorganic amorphous insulating material, such as amorphous silicon (a-silicon), amorphous silicon carbide (a-SiC), amorphous silicon nitride (a-Si1-xNx), or amorphous carbon (a-C). Since grains are not formed in the case where a protective layer is formed using the above described materials, water permeability of the protective layer will be low, and the characteristics of the protective film will improve. Note that the protective layer may be formed by other insulating materials or by a conducting material.

1-2. Manufacturing Method of the Display Device

Figure 5:
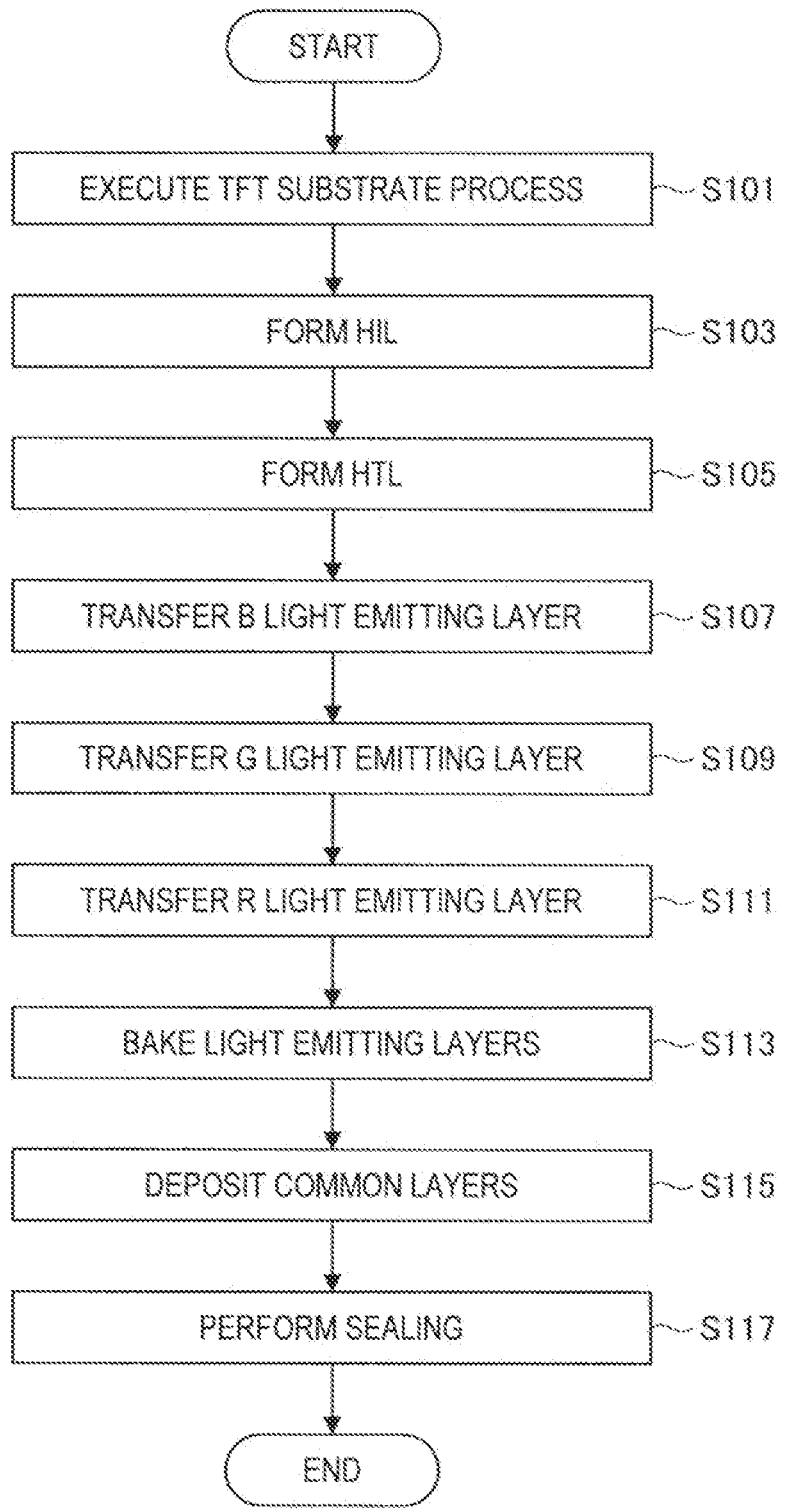
FIG. 5 is a flow chart which shows a manufacturing method of the display device according to the first embodiment of the present disclosure.

Next, a manufacturing method of the display device according to the first embodiment of the present disclosure will be described with reference to FIGS. 5 to 7. FIG. 5 is a flow chart of the manufacturing method. FIGS. 6A to 6D are figures which show the state of the display device at each process of the manufacturing method. FIG. 7 is a figure for describing the transfer of the light emitting layers in the manufacturing method in more detail. Hereinafter, FIGS. 6A to 6D and FIG. 7 will be referred to as appropriate while the manufacturing method is described in accordance with FIG. 5.

(TFT Substrate Process to Formation of the Hole Transport Layer)

With reference to FIG. 5, in the manufacturing method of the organic EL display 100 which is the display device according to the present embodiment, first a TFT substrate process is executed (step S101). The TFT substrate process is treatment for forming the TFT layer 13, the flattening insulating film 14, the lower electrodes 15, and the aperture insulating film 16 over the substrate 11.

From among these, the flattening insulating film 14 is formed, for example, using a photosensitive polyimide. In this case, first an insulating film formed by the photosensitive polyimide is arranged on the TFT layer 13, and is exposed by using a mask which has apertures in the portions corresponding to the connection holes 14H. Next, the insulating film is half exposed by using a mask which has apertures in the portions corresponding to the second regions R2 and the third regions R3. Next, the insulating film is further half exposed by using a mask which has apertures in the portions corresponding to the third regions R3. In this way, the connection holes 14H are formed, and the flattening insulating film 14 is formed with a thickness d1 of the first regions R1 greater than a thickness d2 of the second regions R2, and the thickness d2 of the second regions R2 greater than a thickness d3 of the third regions R3.

Further, the lower electrodes 15 are formed, for example, by patterning a transparent conductive film such as ITO formed over the substrate 11. In this case, the lower electrodes 15 are connected to the drain electrodes of the driving transistors Tr1 in the TFT layer 13, via the connection holes 14H of the flattening insulating film 14.

Further, the aperture insulating film 16 is formed, for example, by forming an inorganic insulating material such as silicon oxide by CVD (Chemical Vapor Deposition) over the substrate 11, and then afterwards patterning by laminating a photosensitive resin onto here.

After forming the aperture insulating film 16, oxygen plasma treatment is performed on the surface of the substrate 11, that is, on the surface of the side on which the lower electrodes 15 and the aperture insulating film 16 are formed. In this way, unnecessary organic matter adhered to the surface of the substrate 11 is removed, and the wettability is improved. In the oxygen plasma treatment, for example, the substrate 11 is heated to a prescribed temperature of approximately 70 degrees Celsius to 80 degrees Celsius, and plasma treatment ($O_2$ plasma treatment) is performed by setting oxygen at atmospheric pressure as a reactive gas. Heretofore, the TFT substrate process of step S101 ends.

Next, the hole injection layer (HIL) 171 is formed over the substrate 11 (step S103). Here, the hole injection layer 171 is formed, for example, by forming the above described materials over the lower electrodes 15 and the aperture insulating film 16 by a spin coating method, and baking for one hour in the atmosphere.

Next, the hole transport layer (HTL) 172 is formed over the substrate 11 (step S105). Here, the hole transport layer 172 is formed, for example, by forming the above described materials by a spin coating method over the hole injection layer 171, and baking for one hour at 180 degrees Celsius under a nitrogen ($N_2$) atmosphere.

Figure 6A:
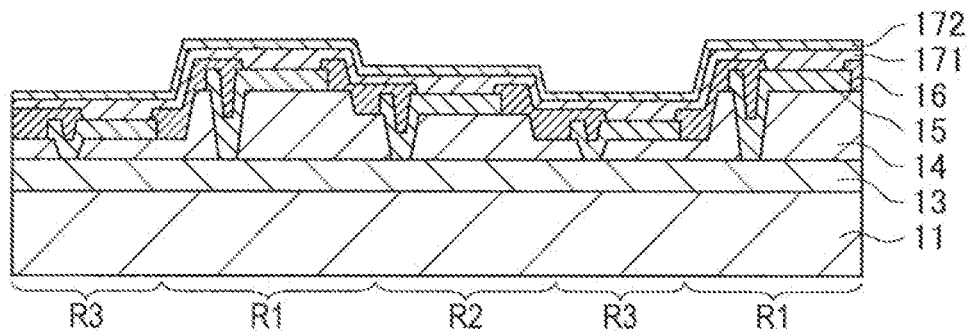
FIG. 6A is a figure which shows a process of the manufacturing method of FIG. 5.
Figure 7:
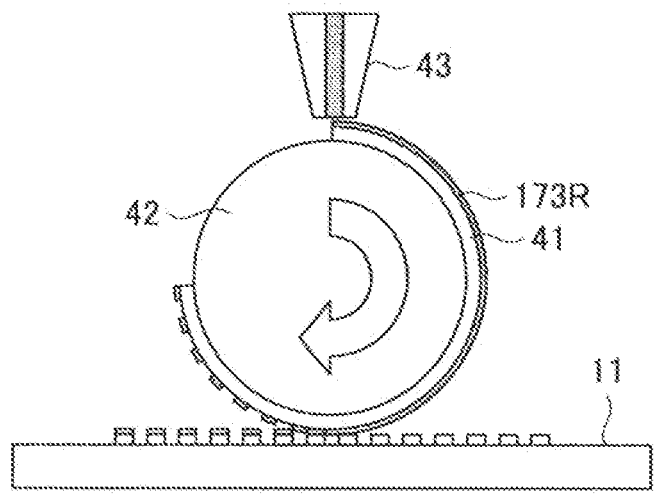
FIG. 7 is a figure for describing the transfer of light emitting layers in the manufacturing method of FIG. 5.

A state up until the above described process of step S105 ends is shown in FIG. 6A. In the process up to here as described above, a step is formed between each region by the flattening insulating film 14 which is a step forming member, and likewise the lower electrodes 15, the aperture insulating film 16, the hole injection layer 171, and the hole transport layer 172 are formed to be shared by each region.

Therefore, the surface of the hole transport layer 172 over the substrate 11 has steps corresponding to the steps formed by the flattening insulating film 14. That is, the surface of the hole transport layer 172 in the first regions R1 is higher than the surface of the hole transport layer 172 in the second regions R2 by (d1-d2). Further, the surface of the hole transport layer 172 in the second regions R2 is higher than the surface of the hole transport layer 172 in the third regions R3 by (d2-d3).

(Formation of the Blue Light Emitting Layer)

Next, the blue light emitting layer 173B is transferred over the substrate 11 (step S107). The blue light emitting layer 173B is applied uniformly on a transfer body, and is transferred to all of the first to third regions R1 to R3 of the substrate 11.

Figure 6B:
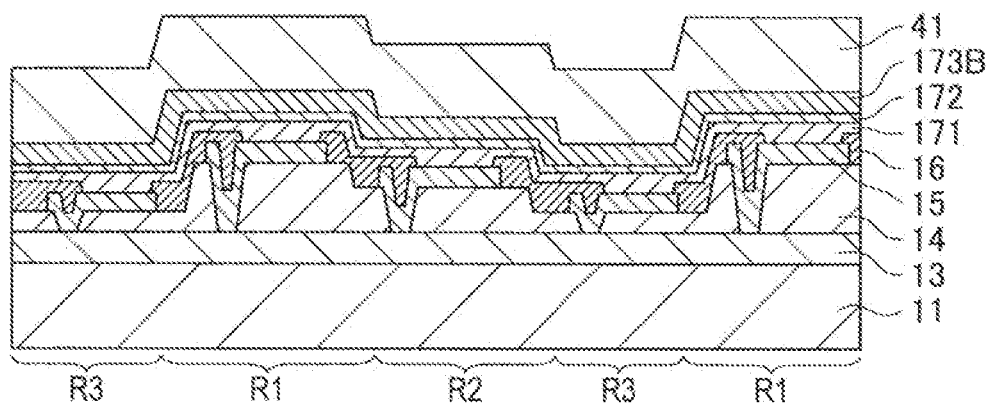
FIG. 6B is a figure which shows a process of the manufacturing method of FIG. 5.

A state at the time when the blue light emitting layer 173B is transferred in step S107 is shown in FIG. 6B. The blue light emitting layer 173B is applied uniformly on a blanket 41 (transfer body) with a surface formed by an elastic material such as silicon gum (for example, STD700: Fujikura Rubber, Ltd.), and is transferred over the hole transport layer 172 at all the first regions R1, the second regions R2 and the third regions R3. In this case, since steps are formed on the surface of the hole transport layer 172, the third regions R3 to which the blue light emitting layer 173B is to be originally transferred will be more concave compared to the other regions. Therefore, in the process for forming the blue light emitting layer 173B by transfer, the contact pressure to the substrate 11 of the blanket 41 is adjusted so that the blue light emitting layer 173B applied on the surface of the blanket 41 contacts the hole transport layer 172 of the third regions R3 beyond the steps. More specifically, the contact pressure of the blanket 41 at the time when transferring the blue light emitting layer 173B is adjusted so as to become greater than the contact pressure of the time when transferring the other two light emitting layers 173.

Note that, in this case, the blanket 41 also naturally contacts the hole transport layer 172 of the first regions R1 and the second regions R2. Therefore, the blue light emitting layer 173B is also transferred to the first regions R1 and the second regions R2. However, as described above, since the light emitting layers with a long emission wavelength will more easily emit light, the red light emitting layer 173R and the green light emitting layer 173G will more easily emit light than the blue light emitting layer 173B. Accordingly, even if the blue light emitting layer 173B is transferred to the first regions R1 and the second regions R2, emitted red and green light will be obtained by the red light emitting layer 173R and the green light emitting layer 173G transferred by being superimposed onto here.

Here, in order to further suppress the emitted light from light emitting materials of a short wavelength side, the emitted light of a short wavelength side may be cut by including, for example, color filters over the substrate 11. Further, the emitted light of a short wavelength side may be suppressed by the selection of the material which forms the light emitting layers 173, or by adjusting the carrier balance by blending the materials of hole transportation or electron transportation with the light emitting layers 173.

(Formation of the Green Light Emitting Layer)

Next, the green light emitting layer 173G is transferred over the substrate 11 (step S109). While the green light emitting layer 173G is also applied uniformly on the blanket 41 and then transferred over the substrate 11, it differs from the blue light emitting layer 173B in that it is not transferred to the third regions R3. Therefore, in the process of the transfer of the green light emitting layer 173G, the steps formed over the substrate 11 such as described above are used, and the green light emitting layer 173G is selectively transferred over the substrate 11 by contacting the transfer body to the substrate 11 with a suitable contact pressure.

An example of the process for selectively transferring the green light emitting layer 173G over the substrate 11 is shown in FIG. 7. Note that, in the present embodiment, the red light emitting layer 173R is also selectively transferred over the substrate 11 by a similar process.

First, the green light emitting layer 173G is applied uniformly on the surface of the blanket 41 which is a transfer body. Here, the blanket 41 is wound around a cylindrical shaped roll 42. The material of the green light emitting layer 173G is dissolved in an organic solvent, and is coated on the surface of the blanket 41 by using a slit coat die 43.

Next, the green light emitting layer 173G is transferred over the substrate 11 by moving the roll 42 in a state where the blanket 41 contacts the substrate 11 with a suitable contact pressure. In this case, because of the steps formed over the substrate 11, the green light emitting layer 173G is selectively transferred over the portions corresponding to the upper parts of the steps, that is, to the first regions R1 and the second regions R2. The green light emitting layer 173G remaining on the blanket 41 is removed, for example, by using a cleaning roller. Or, the green light emitting layer 173G remaining on the blanket 41 may be re-used when next transferring the green light emitting layer 173G.

Figure 6C:
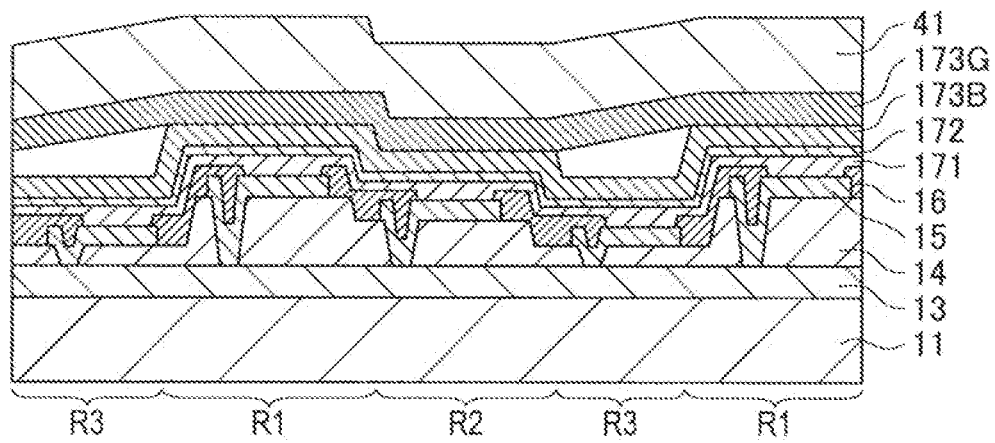
FIG. 6C is a figure which shows a process of the manufacturing method of FIG. 5.

A state at the time when the green light emitting layer 173G is transferred in step S109 is shown in FIG. 6C. While the green light emitting layer 173G is applied uniformly on the blanket 41 in a manner similar to that of the blue light emitting layer 173B, it differs from the blue light emitting layer 173B transferred to all the first regions R1, the second regions R2, and the third regions R3 in that it is selectively transferred on the hole transport layer 172 of the first regions R1 and the second regions R2. In this case, because of the steps formed on the surface of the hole transport layer 172, the second regions R2 are higher than the third regions R3. Therefore, the blanket 41 does not contact the hole transport layer 172 in the third regions R3, and the green light emitting layer 173G does not adhere to the third regions R3.

On the other hand, because of the steps formed on the surface of the hole transport layer 172, the second regions R2 are lower than the first regions R1. Therefore, in the process for forming the green light emitting layer 173G by transfer, the contact pressure to the substrate 11 of the blanket 41 is adjusted so that the transfer pattern on the blanket 41 contacts the hole transport layer 172 of the second regions R2 beyond the steps between the first regions R1 and the second regions R2. More specifically, the contact pressure of the blanket 41 at the time when transferring the green light emitting layer 173G is adjusted so as to become greater than the contact pressure of the time when transferring the red light emitting layer 173R.

Note that, in this case, the blanket 41 also naturally contacts the hole transport layer 172 of the first regions R1. Therefore, the green light emitting layer 173G is also transferred on the first regions R1. However, the red light emitting layer 173R has light of a wavelength longer than that of the green light emitting layer 173G and emits light more easily. Accordingly, even if the green light emitting layer 173G is transferred to the first regions R1, emitted red light is obtained by the red light emitting layer 173R transferred by being superimposing onto here. Note that, similar to the case of the above described blue light emitting layer 173B, the emitted light of the green light emitting layer 173G (and the blue light emitting layer 173B) may be further suppressed in the first regions R1 by color filters, the adjustment of a carrier balance of the light emitting layers 173 or the like.

(Formation of the Red Light Emitting Layer)

Next, the red light emitting layer 173R is transferred over the substrate 11 (step S111). While the red light emitting layer 173R is also applied uniformly on the blanket 41 and then transferred over the substrate 11, the red light emitting layer 173R is transferred to only the first regions R1. Therefore, in the process for transferring the red light emitting layer 173R, the steps formed over the substrate 11 such as described above are used, and the red light emitting layer 173R is selectively transferred over the substrate 11 by contacting the transfer body to the substrate 11 with a suitable contact pressure.

Figure 6D:
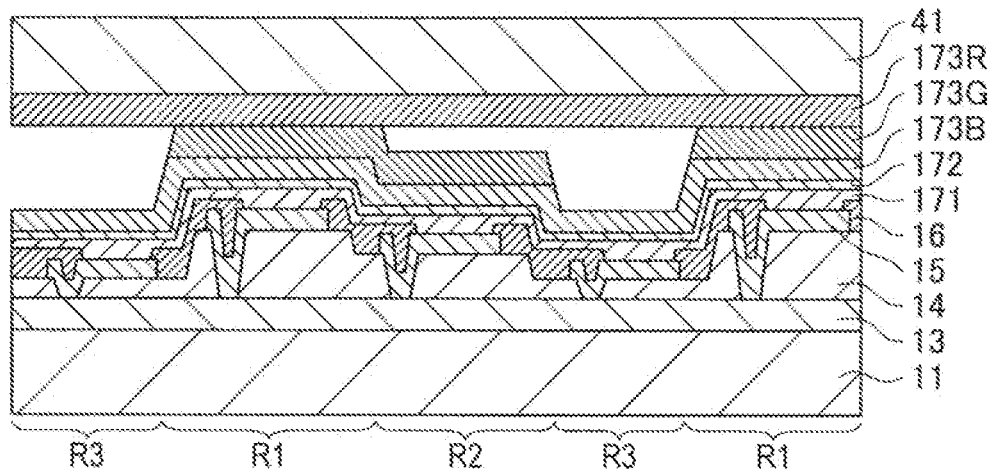
FIG. 6D is a figure which shows a process of the manufacturing method of FIG. 5.

A state at the time when the red light emitting layer 173R is transferred in step S111 is shown in FIG. 6D. The red light emitting layer 173R is selectively transferred on the hole transport layer 172 of the first regions R1. Here, because of the steps formed on the surface of the hole transport layer 172, the first regions R1 will be more concave compared to the other regions. Therefore, in the step which forms the red light emitting layer 173R by transfer, the contact pressure of the blanket 41 is adjusted so that the red light emitting layer 173R applied uniformly on the blanket 41 does not go beyond the steps between the first regions R1 and the second regions R2, and does not adhere to the hole transport layer 172 of the second regions R2 and the third regions R3. More specifically, the contact pressure of the blanket 41 at the time when transferring the red light emitting layer 173R is adjusted so as to become lower than the contact pressure of the time when transferring the other two light emitting layers 173.

Next, the blue light emitting layer 173B, the green light emitting layer 173G, and the red light emitting layer 173R each transferred in steps S107 to S111 are dried, for example, by baking for two hours at 130 degrees Celsius under a nitrogen atmosphere (step S113).

(Formation of the Common Layers to Sealing)

Next, common layers are deposited over the substrate 11 to which the light emitting layers 173 are formed (step S115). In the present embodiment, the common layers are the electron injection layer 175 and the upper electrode 18. It is desirable for these common layers to be formed continuously within the same film forming apparatus. This is because when the substrate 11 is exposed to the atmosphere during the formation of these layers, there is the possibility that deterioration of the materials will occur due to moisture in the atmosphere. Note that, in this step, a protective layer may be formed over the upper electrode 18.

Next, each layer formed through the above described processes is sealed by a sealing substrate 21 (step S117). More specifically, a resin or the like of the adhesion layer 22 is applied on top of the common layers formed in step S115, and then afterwards the sealing substrate 21 is aligned and bonded, and the adhesion layer 22 is hardened.

The organic EL display 100 is completed through the above described processes.

1-3. Application to an Electronic Apparatus

Figure 8:
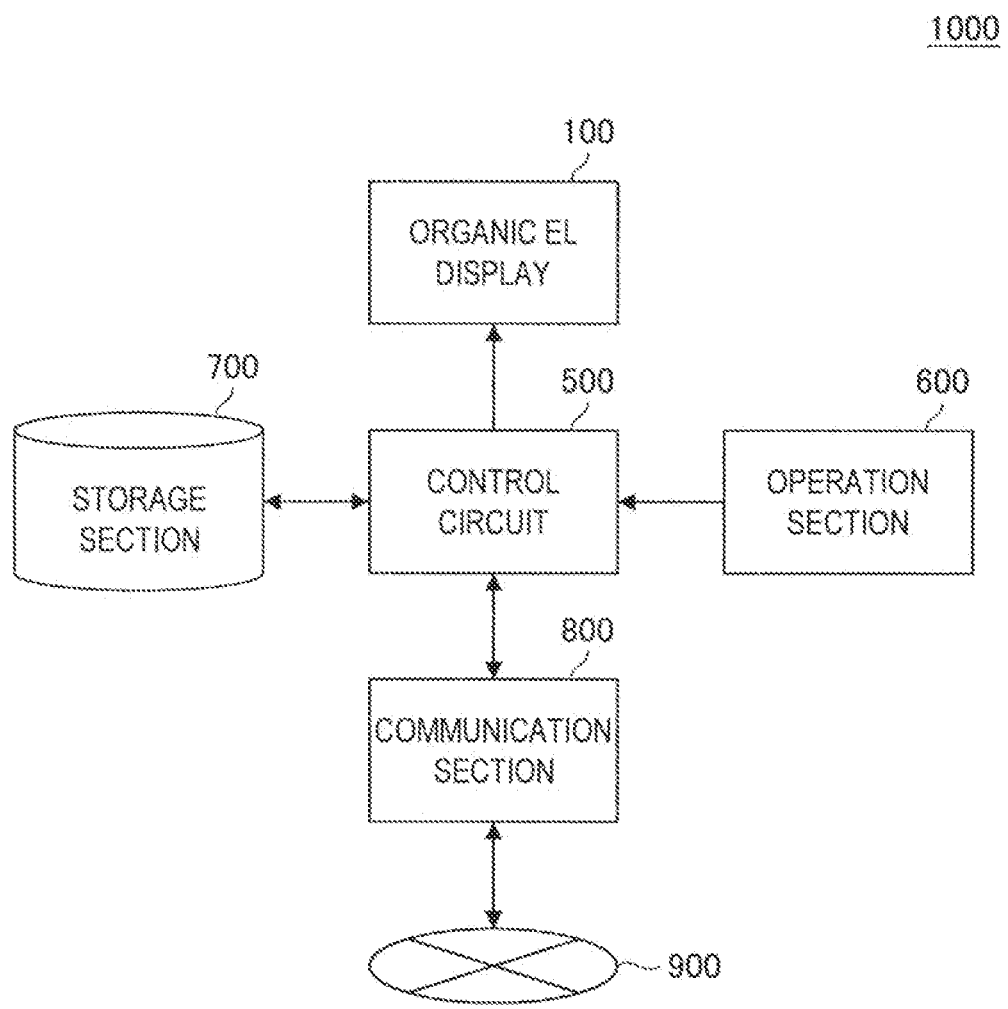
FIG. 8 is a schematic block diagram which shows a configuration of an electronic apparatus, which has the display device according to the first embodiment of the present disclosure.

Next, a configuration of an electronic apparatus, which has the display device according to the first embodiment of the present disclosure, will be described with reference to FIG. 8. FIG. 8 is a schematic block diagram which shows a configuration of an electronic apparatus.

With reference to FIG. 8, an electronic apparatus 1000 includes an organic EL display 100, a control circuit 500, an operation section 600, a storage section 700, and a communication section 800. The electronic apparatus 1000 is, for example, some apparatus which has the organic EL display 100 as a display section, such as a television, a mobile phone (smartphone), a digital camera, or a personal computer.

The control circuit 500 is constituted, for example, by a CPU (Central Processing Unit), a RAM (Random Access Memory), a ROM (Read Only Memory) and the like, and controls each section of the electronic apparatus 1000. The organic EL display 100 is also controlled by this control circuit 500.

The operation section 600 includes, for example, a touch panel, buttons, a keyboard, a mouse and the like, and receives operation inputs of a user for the electronic apparatus 1000. The control circuit 500 controls the electronic apparatus 1000 in accordance with the operation inputs acquired by the operation section 600.

The storage section 700 includes, for example, a semiconductor memory, a magnetic disk, an optical disk and the like, and stores various data which may be necessary for the electronic apparatus 1000 to function. The control circuit 500 may operate by reading and executing programs stored in the storage section 700.

The communication section 800 is additionally included. The communication section 800 is a communication interface connected to a wired or wireless network 900, and includes, for example, a modem and port, an antenna and the like. The control circuit 500 receives data from the network 900, or transmits data to the network 900, via the communication section 800.

Not only the above described organic EL display 100, but also the electronic apparatus 1000 which has this organic EL display 100 is included in the embodiments of the present disclosure.

1-4. Modified Example

A modified example of the above described first embodiment of the present disclosure will be described.

For example, as described above, the organic EL display 100 may include other constituent elements, such as color filters or a protective layer, which are not shown in the figures. The organic EL display 100 is not limited to a bottom emission type such as in the example shown in the figures, and may be a top emission type. Further, the pixel driving circuit 140 is not limited to an active type driving circuit, and may be a passive type driving circuit.

Further, while the blue light emitting layer 173B is formed by transfer in the above described example, the blue light emitting layer 173B may be formed, for example, by a different method such as coating or depositing. Since the blue light emitting layer 173B is formed on all the first to third regions R1 to R3, this forming method may be arbitrarily selected.

Further, while the flattening insulating film 14 is used as a step forming member in the above described example, another member may be used as a step forming member. For example, in the case where color filters are included over the substrate 11, the above described steps may be formed by the presence or absence of the color filters, or by a difference in the thickness of the color filters. Further, the unevenness of the surface of the TFT layer 13 may be used as the above described steps. In addition, the above described steps may be formed by a difference in the thickness of the hole injection layer 171 or the hole transport layer 172, or by ribs of the aperture insulating film 16. That is, it is possible to use a variety of constituent elements which are positioned over the substrate 11 side from the light emitting layers 173 as a step forming member. Note that an example which uses color filters and an example which uses the TFT layer 13 will be described in detail as modified examples of the following second embodiment.

2. The Second Embodiment

2-1. Configuration of the Display Device

Figure 9:
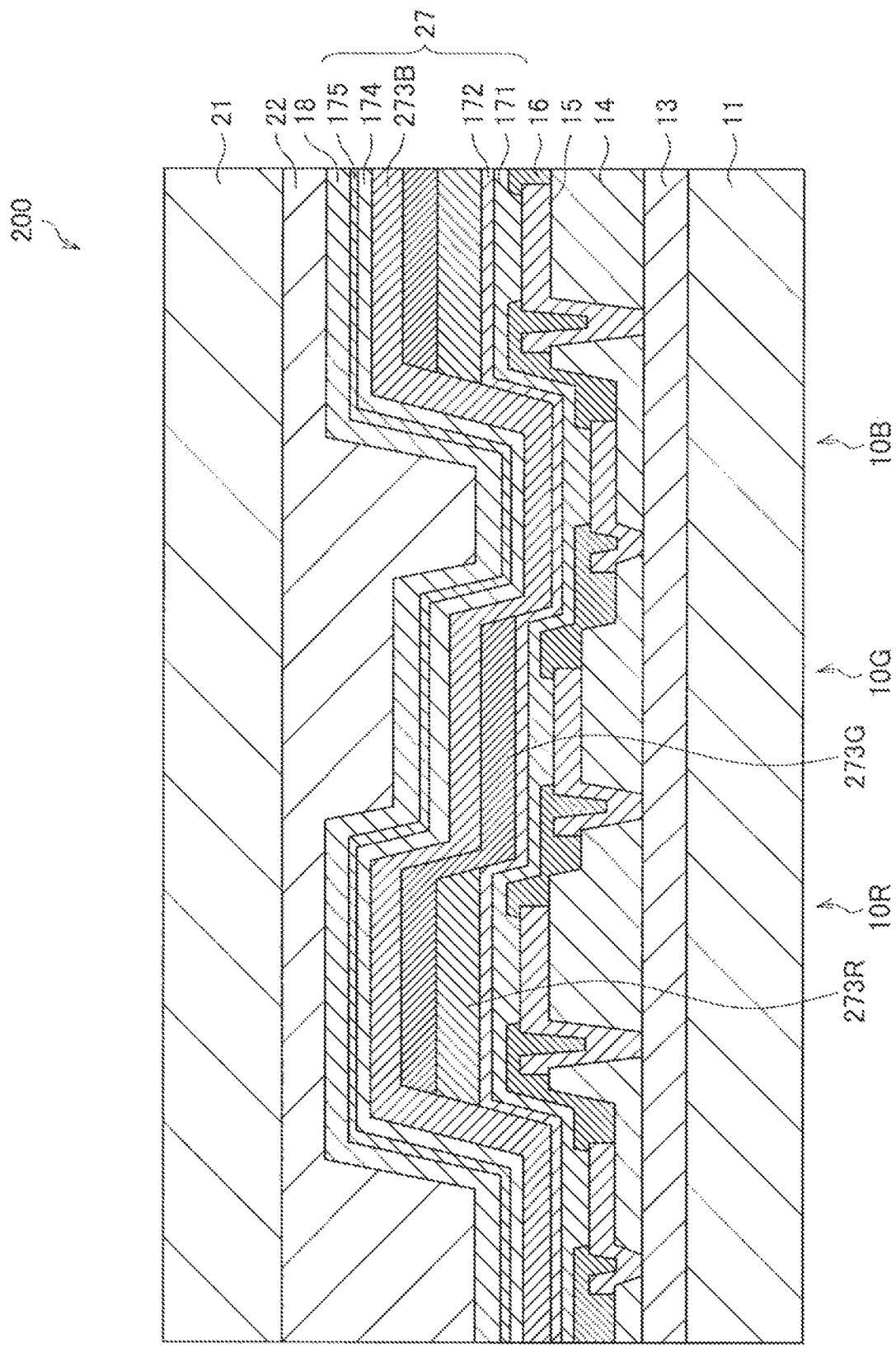
FIG. 9 is a cross section view for a display region of a display device according to a second embodiment of the present disclosure.

Next, a configuration of a display device according to a second embodiment of the present disclosure will be described with reference to FIG. 9. FIG. 9 is a figure for describing a display region of the display device.

The display device according to the present embodiment is an organic EL display 200. Note that since the configurations in the present embodiment for the overall configuration of the display device and the planar configuration of the display region are substantially the same as the configurations described with reference to FIGS. 1 to 3 in the above described first embodiment, a detailed description of these configurations will be omitted.

As shown in FIG. 9, a TFT layer 13, a flattening insulating film 14, lower electrodes 15, an aperture insulating film 16, organic layers 27, an upper electrode 18, an adhesion layer 22, and a sealing substrate 21 are included over the substrate 11, in this sequence from the substrate 11. Since the configuration in the present embodiment of these elements, apart from the organic layers 27, is substantially the same as the configuration described with reference to FIG. 4 in the above described first embodiment, a detailed description of this configuration will be omitted.

The organic layers 27 include a hole injection layer (HIL) 171, a hole transport layer (HTL) 172, emitting layers (EML) 273, an electron transport layer (ETL) 174, and an electron injection layer (EIL) 175, in this sequence from the substrate 11. A red light emitting layer 273R at the red light emitting elements 10R, and a green light emitting layer 273G at the green light emitting elements 10G are each included as the light emitting layers 273. Further, a blue light emitting layer 273B is included to be shared by each of the light emitting elements which include blue light emitting elements 10B.

Note that since the hole injection layer 171, the hole transport layer 172, the electron transport layer 174, and the electron injection layer 175 are constituent elements substantially the same as those of the above described first embodiment, a detail description thereof will be omitted. Further, since the red light emitting layer 273R and the green light emitting layer 273G are constituent elements substantially the same as the red light emitting layer 173R and the green light emitting layer 173G of the first embodiment, excluding the formation order, a detail description thereof will be omitted.

The blue light emitting layer 273B, similar to the other light emitting layers, emits light by causing a recombination of electrons and holes by applying an electric field. The blue light emitting layer 273B is formed, for example, using a light emitting material having at least one peak wavelength in the range of 450 nanometers to 495 nanometers. More specifically, the blue light emitting layer 273B is formed by doping an organic light emitting material, such as a blue or green low molecular fluorescent pigment, a phosphorescence pigment, or a metallic complex as a guest material, in an anthracene compound as a host material.

In the present embodiment, in contrast to forming the red light emitting layer 273R and the green light emitting layer 273G by transfer, the blue light emitting layer 273B is formed to be shared by the first regions R1, the second regions R2, and the third regions R3, by deposition. Since the blue light emitting layer 273B is formed after the other light emitting layers 273 are transferred, the blue light emitting layer 273B is formed over the red light emitting layer 273R and the green light emitting layer 273G in the first regions R1, and the blue light emitting layer 273B is formed over the green light emitting layer 273G in the second regions R2.

Further, in the present embodiment, the formation sequence of the red light emitting layer 273R and the green light emitting layer 273G is different from that of the above described first embodiment. As described previously, in the present embodiment, the red light emitting layer 273R is transferred first, and after this the green light emitting layer 273G is transferred. Here, similar to the first embodiment, the green light emitting layer 273G is transferred not only to the second regions R2 but also to the first regions R1. Accordingly, the green light emitting layer 273G is formed over the red light emitting layer 273R in the first regions R1.

In this way, in the embodiments of the present disclosure, a given formation sequence of each light emitting layer may be set. For example, in the case where light emitting layers of the three colors R (red), G (green), and B (blue) are formed such as in the first and second embodiments, it is possible to set the formation sequence to that of a given sequence, such as (B, R, G), (R, B, G), (G, R, B), or (G, B, R), instead of (B, G, R) of the first embodiment or (R, G, B) of the second embodiment. This is also similar, for example, for cases other than three colors, where two light emitting layers or four or more light emitting layers are formed.

2-2. Manufacturing Method of the Display Device

Figure 10:
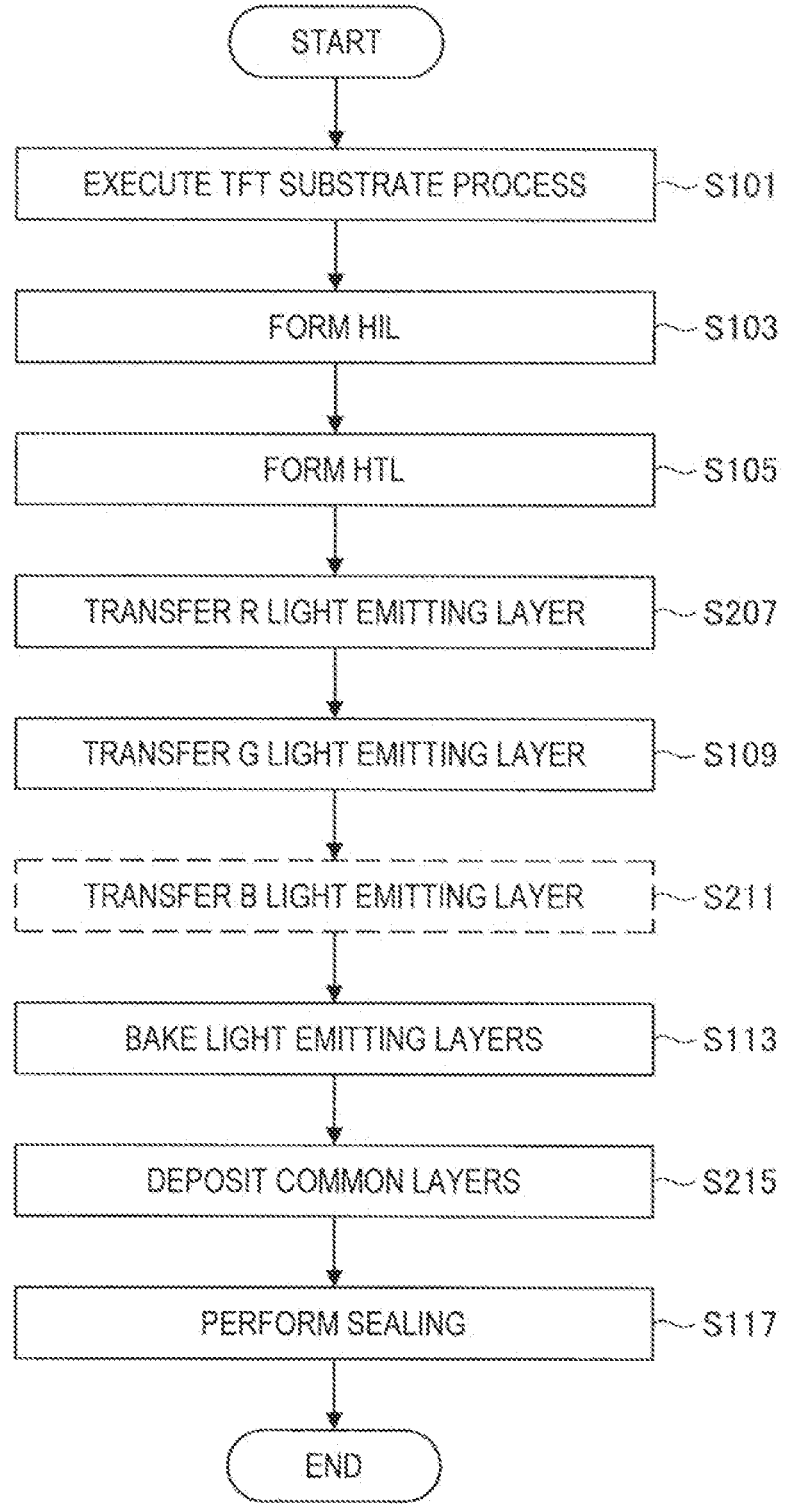
FIG. 10 is a flow chart which shows a manufacturing method of the display device according to the second embodiment of the present disclosure.

Next, a manufacturing method of the display device according to the second embodiment of the present disclosure will be described with reference to FIGS. 10 and 11A to 11D. FIG. 10 is a flow chart of the manufacturing method. FIGS. 11A to 11D are figures which show the state of the display device at each process of the manufacturing method. Hereinafter, FIGS. 11A to 11D will be referred to as appropriate while the manufacturing method is described in accordance with FIG. 10.

(TFT Substrate Process to the Formation of the Hole Transport Layer)

With reference to FIG. 10, in the manufacturing method of the organic EL display 200 which is the display device according to the present embodiment, the TFT layer 13, the flattening insulating film 14, the lower electrodes 15, the aperture insulating film 16, the hole injection layer (HIL) 171, and the hole transport layer (HTL) 172 are formed over the substrate 11, similar to the processes described with reference to FIG. 5 in the above described first embodiment, by steps S101 to S105.

Figure 11A:
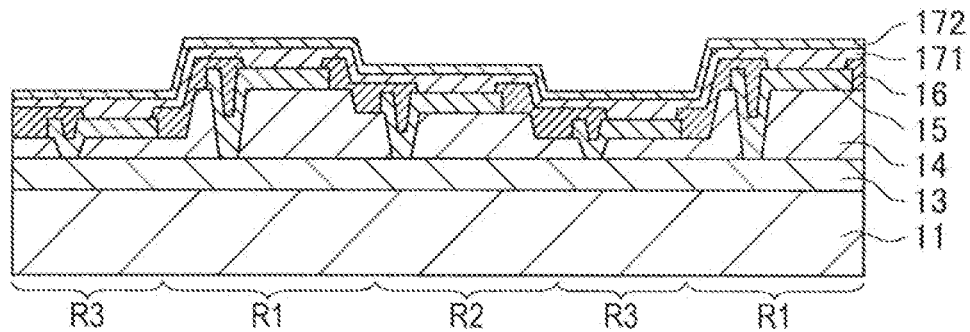
FIG. 11A is a figure which shows a process of the manufacturing method of FIG. 10.

A state up until the above described process of step S105 ends is shown in FIG. 11A. In the process up to here, a step is formed between each region by the flattening insulating film 14 which is a step forming member, and likewise the lower electrodes 15, the aperture insulating film 16, the hole injection layer 171, and the hole transport layer 172 are formed to be shared by each of the regions.

(Formation of the Red Light Emitting Layer and the Green Light Emitting Layer)

Next, the red light emitting layer 273R and the green light emitting layer 273G are each formed by being transferred over the substrate 11 (steps S207 and S209).

Figure 11B:
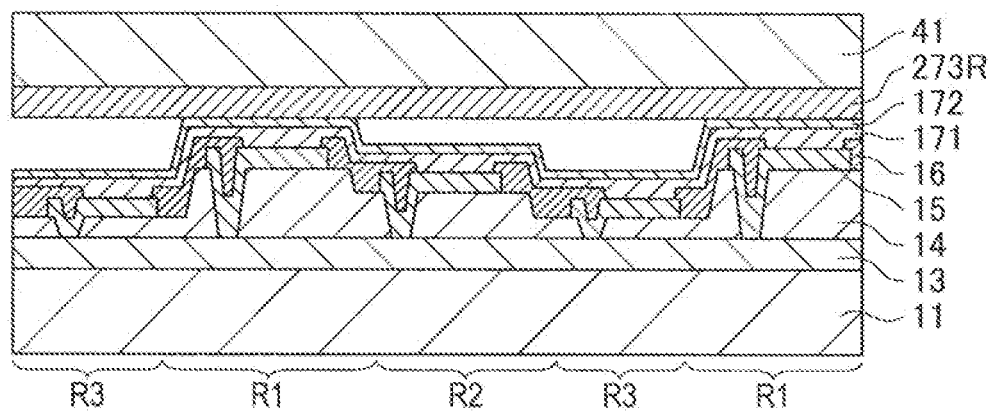
FIG. 11B is a figure which shows a process of the manufacturing method of FIG. 10.

A state at the time when the red light emitting layer 173R is transferred in step S107 is shown in FIG. 11B. The red light emitting layer 173R, similar to that of the first embodiment, is selectively transferred to the first regions R1 by using the steps formed on the surface of the hole transport layer 172. The contact pressure of the blanket 41 is adjusted so that the red light emitting layer 173R applied on the blanket 41 does not go beyond the steps between the first regions R1 and the second regions R2, and does not adhere to the hole transport layer 172 of the second regions R2 and the third regions R3.

Figure 11C:
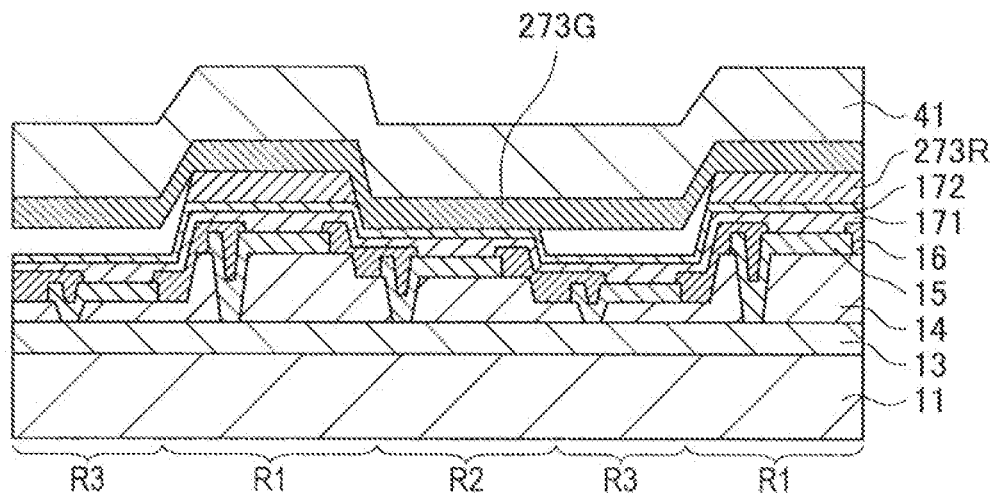
FIG. 11C is a figure which shows a process of the manufacturing method of FIG. 10.

A state at the time when the green light emitting layer 173G is transferred in step S109 is shown in FIG. 11C. The green light emitting layer 173G, similar to that of the first embodiment, is selectively transferred to the first regions R1 and the second regions R2 by using the steps formed on the surface of the hole transport layer 172. The contact pressure of the blanket 41 is adjusted so that the green light emitting layer 173G applied on the blanket 41 does not go beyond the steps between the second regions R2 and the third regions R3, and does not adhere to the hole transport layer 172 of the third regions R3.

Note that, while the blue light emitting layer 273B is formed by deposition in the example shown in the figures, the blue light emitting layer 273B may also be formed by transfer similar to that of the red light emitting layer 273R and the green light emitting layer 273G. In this case, after the above described step S209, a process for forming the blue light emitting layer 273B over the substrate 11 by transfer (step S211) is executed. In this case, the contact pressure of the blanket 41 is adjusted so that the blue light emitting layer 273B is transferred on the hole transport layer 172 of the third regions R3 beyond the steps.

Next, the red light emitting layer 273R and the green light emitting layer 273G each transferred in steps S207 and S209 are dried, for example, by baking for two hours at 130 degrees Celsius under a nitrogen atmosphere (step S113).

(Formation of the Common Layers to Sealing)

Figure 11D:
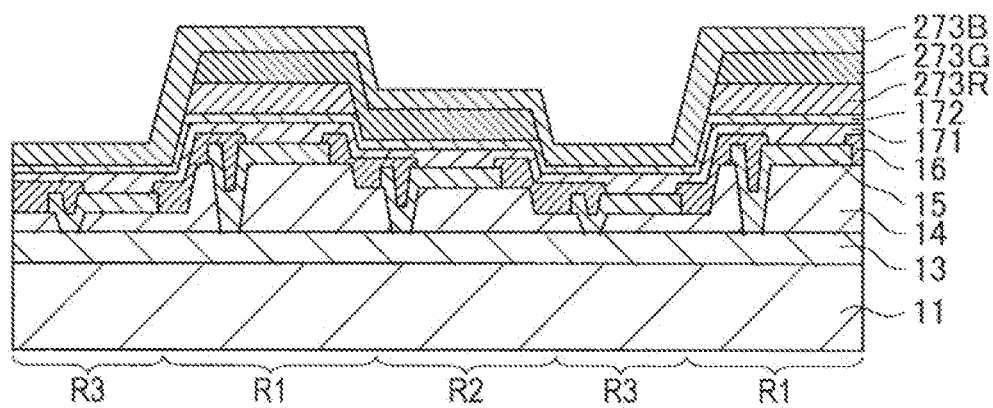
FIG. 11D is a figure which shows a process of the manufacturing method of FIG. 10.

Next, common layers are deposited over the substrate 11 to which the red light emitting layer 273R and the green light emitting layer 273G are formed (step S215). In the present embodiment, the common layers are the blue light emitting layer 273B, the electron transport layer 174, the electron injection layer 175 and the upper electrode 18. A state at the time when depositing the blue light emitting layer 273B in step S215 is shown in FIG. 11D. Similar to that of the first embodiment, it is desirable for these common layers to be formed continuously within the same film forming apparatus. Further, in this process, a protective layer may be formed over the upper electrode 18.

Next, each layer formed through the above described processes is sealed by a sealing substrate 21, similar to that of the first embodiment (step S117). The organic EL display 200 is completed through the above described processes.

Note that, similar to the case of the above described first embodiment, an electronic apparatus which has the organic EL display 200 is included in the embodiments of the present disclosure.

2-3. Modified Example

A modified example of the above described second embodiment of the present disclosure will be described.

(Example of Using Color Filters as a Step Forming Member)

Figure 12:
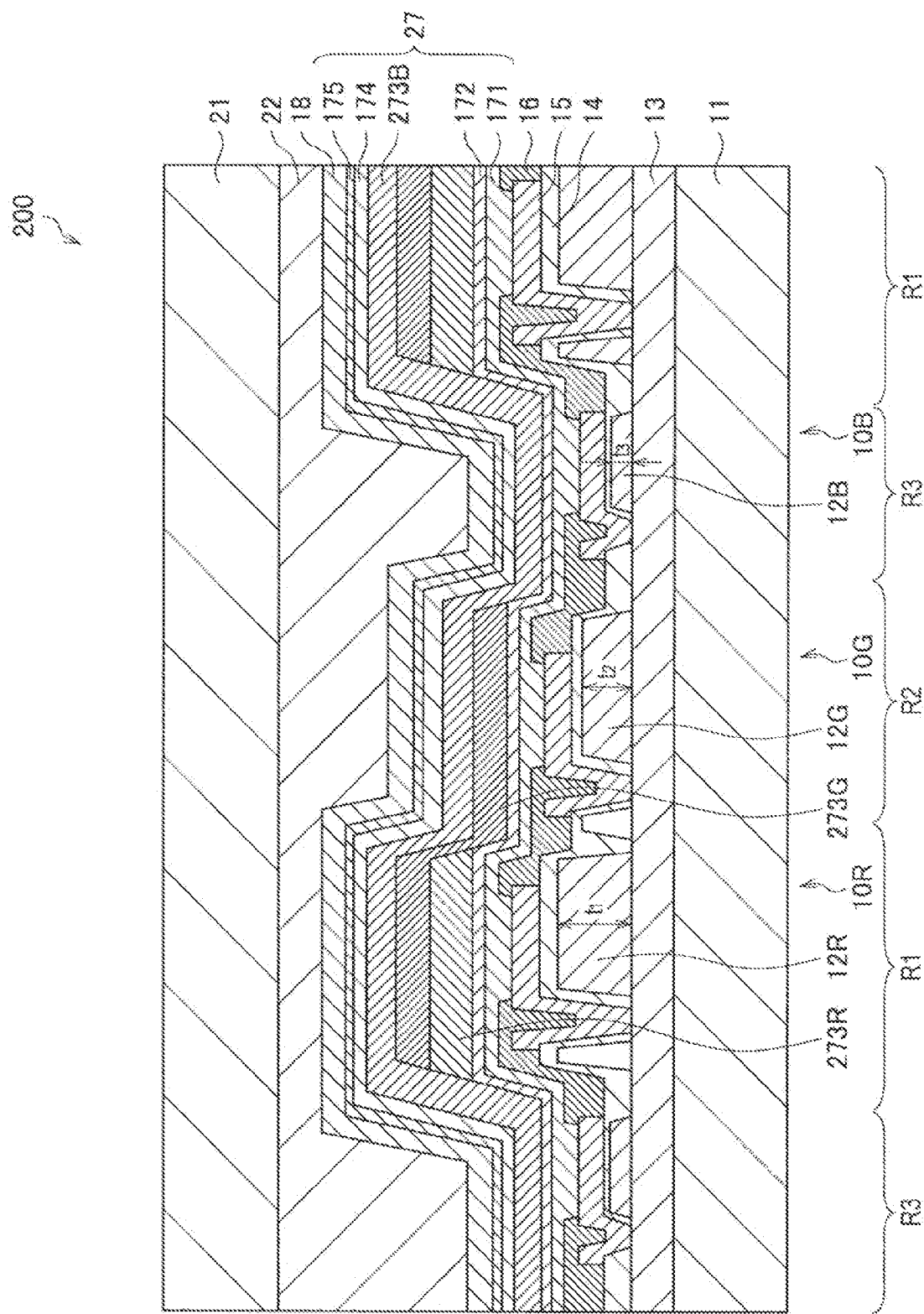
FIG. 12 is a figure which shows a modified example of the second embodiment of the present disclosure.

FIG. 12 is a figure which shows a modified example which uses color filters 12 in place of the flattening insulating film 14 as a step forming member.

With reference to FIG. 12, the color filters 12 are, for example, on-chip color filters included between the TFT layer 13 and the flattening insulating film 14. The color filters 12 include red filters 12R for the red light emitting elements 10R, green filters 12G for the green light emitting elements 10G, and blue filters 12B for the blue light emitting elements 10B. Here, the thickness t1 of the red filters 12R included in the first regions R1 is greater than the thickness of the green filters 12G included in the second regions R2. Further, the thickness t2 of the green filters 12G included in the second regions R2 is greater than the thickness t3 of the blue filters 12B included in the third regions R3.

In this way, steps of a size (t1-t2) are formed between the first regions R1 and the second regions R2. Further, steps of a size (t2-t3) are formed between the second regions R2 and the third regions R3. That is, in the present modified example, the color filters 12 have a function of a step forming member.

Note that while the red filters 12R, the green filters 12G, and the blue filters 12B are all included in the above described example, the blue filters 12B from among these, for example, may not be included. In this case, steps of a size t2 are formed between the second regions R2 and the third regions R3. In this way, the color filters 12 may form steps by the different thicknesses in each of the regions, or may form steps by including a restriction to the regions which correspond to the upper parts of the steps.

In this way, in the case where the color filters 12 are used as a step forming member, the process for forming the steps on the flattening insulating film 14 may become unnecessary. Further, in the case where the color filters may be unnecessary, separate color filters, such as a color filter substrate, may not be included.

(Example of Using the TFT Layer as a Step Forming Member)

Figure 13:
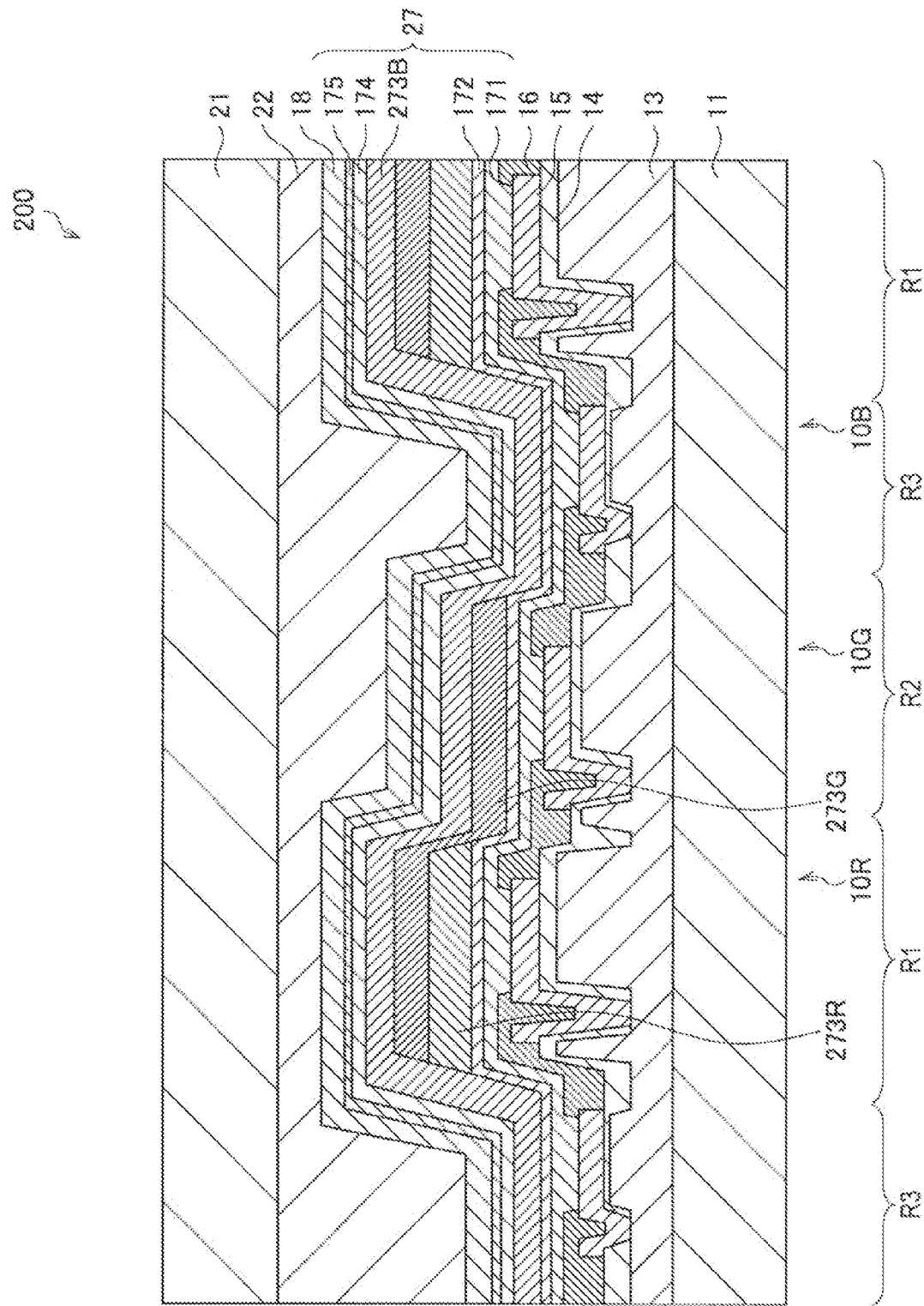
FIG. 13 is a figure which shows another modified example of the second embodiment of the present disclosure.

FIG. 13 is a figure which shows a modified example which uses the TFT layer 13 in place of the flattening insulating film 14 as a step forming member in the present embodiment.

With reference to FIG. 13, in the present embodiment, the unevenness of the surface of the TFT layer 13 is used for forming the steps over the substrate 11. This unevenness is formed, for example, by the transistors and capacitors included in the pixel driving circuits 140 formed on the TFT layer 13. If the pixel driving circuits 140 are designed so that this unevenness forms desired steps over the substrate 11, it is possible to use the TFT layer 13 as a step forming member.

In this way, in the case where the TFT layer 13 is used as a step forming member, the process for forming the steps on the flattening insulating film 14 may become unnecessary. Further, color filters may or may not be included with a given shape. In such a way, the flexibility of the design for the other constituent elements will increase.

Note that, besides this, it is possible for each configuration described as modified examples of the above described first embodiment to be applied to the present embodiment.

3. The Third Embodiment 3-1. Configuration of the Display Device

Figure 14:
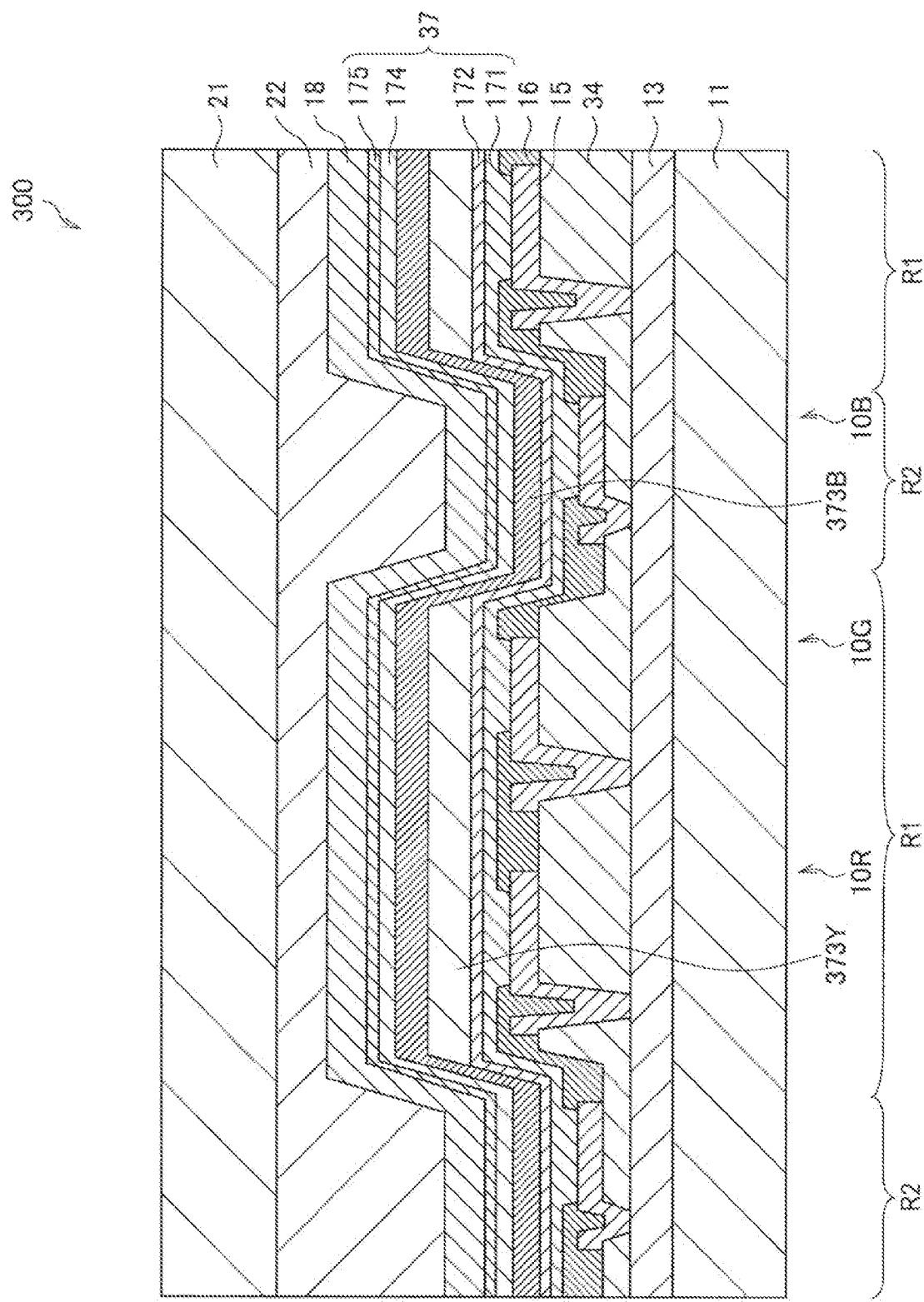
FIG. 14 is a cross section view for a display region of a display device according to a third embodiment of the present disclosure.

Next, a configuration of a display device according to a third embodiment of the present disclosure will be described with reference to FIG. 14. FIG. 14 is a figure for describing a display region of the display device.

The display device according to the present embodiment is an organic EL display 300. Note that since the configurations in the present embodiment for the overall configuration of the display device and the planar configuration of the display region are substantially the same as the configurations described with reference to FIGS. 1 to 3 in the above described first embodiment, a detailed description of these configurations will be omitted.

As shown in FIG. 14, a TFT layer 13, a flattening insulating film 34, lower electrodes 15, an aperture insulating film 16, organic layers 37, an upper electrode 18, an adhesion layer 22, and a sealing substrate 21 are included over the substrate 11, in this sequence from the substrate 11. Since the configuration in the present embodiment of these elements, apart from the flattening insulating film 34 and the organic layers 37, is substantially the same as the configuration described with reference to FIG. 4 in the above described first embodiment, a detailed description of this configuration will be omitted.

The organic layers 37 include a hole injection layer (HIL) 171, a hole transport layer (HTL) 172, emitting layers (EML) 373, an electron transport layer (ETL) 174, and an electron injection layer (EIL) 175, in this sequence from the substrate 11. A yellow light emitting layer 373Y at the red light emitting elements 10R and the green light emitting elements 10G, and a blue light emitting layer 373B at the blue light emitting elements 10B, are each included as the light emitting layers 373.

Note that since the hole injection layer 171, the hole transport layer 172, the electron transport layer 174, and the electron injection layer 175 are constituent elements substantially the same as those of the above described first embodiment, a detail description thereof will be omitted.

The light emitting layers 373, that is, the yellow light emitting layer 373Y and the blue light emitting layer 373B, emit light by causing a recombination of electrons and holes by applying an electric field. The yellow light emitting layer 373Y is formed in the first regions R1 over the substrate 11 formed by the red light emitting elements 10R and the green light emitting elements 10G. The blue light emitting layer 373B is formed in both the first regions R1 and the second regions R2 over the substrate 11. Note that, since the light emitting layers 373 in the present embodiment only includes the two types of the yellow light emitting layer 373Y and the blue light emitting layer 373B, the regions of the substrate 11 are either the first regions R1 or the second regions R2.

Note that the yellow light emitting layer 373Y is formed, for example, by a light emitting material having at least one peak wavelength in the range of 500 nanometers to 750 nanometers. Further, the blue light emitting layer 373B is formed, for example, by a light emitting material having at least one peak wavelength in the range of 450 nanometers to 495 nanometers. The specific materials of the yellow light emitting layer 373Y and the blue light emitting layer 373B are similar to those of the light emitting layers 173 of the first embodiment.

Further, the yellow light emitting layer 373Y and the blue light emitting layer 373B, similar to the light emitting layers 173 of the first embodiment, are formed by the light emitting layer uniformly applied on the blanket being transferred to prescribed regions of the substrate 11. In this case, the yellow light emitting layer 373Y transferred to the first regions R1 is prevented from adhering to the second regions R2 by steps formed by the flattening insulating film 34. Accordingly, the blue light emitting layer 373B is not affected by color mixing or the like due to adhering by the yellow light emitting layer 373Y, in which light with a long wavelength is more easily emitted.

On the other hand, the blue light emitting layer 373B is also transferred to the first regions R1 as well as the second regions R2 to be transferred originally. However, as described later, the influence to the yellow light emitting layer 373Y by applying the blue light emitting layer 373B, which does not easily emit light of a short wavelength, will be small.

The light of the yellow light emitting layer 373Y is extracted as red or green light, by transmitting the light through color filters included over the substrate 11 (not shown in the figures), for example, through red color filters included to correspond to the red light emitting elements 10R and green color filters included to correspond to the green light emitting elements 10G.

The flattening insulating film 34, similar to the flattening insulating film 14 of the first embodiment, flattens the surface of the TFT layer 13, or forms steps over the substrate 11. The thickness d1 of the flattening insulating film 34 in the first regions R1 formed by the yellow light emitting layer 373Y is greater than the thickness d2 of the flattening insulating film 34 in the second regions R2 formed by the blue light emitting layer 373B. In this way, steps of a size (d1-d2) are formed between the first regions R1 and the second regions R2. These steps prevent the yellow light emitting layer 373Y transferred to the first regions R1 from adhering to the second regions R2.

As described above, the light emitting layers 373 includes only two types in the present embodiment. Therefore, the step of the substrate 11 formed by the flattening insulating film 34, which is a step forming member, is two steps in the present embodiment, in contrast to the three steps in the first embodiment. In this way, in the embodiments of the present disclosure, the number of steps formed over the substrate corresponds to the number of types of light emitting layers.

Note that the organic EL display 300 is manufactured by a manufacturing method which replaces the two processes of steps S107 and S109, which form the red light emitting layer and the green light emitting layer, from within the manufacturing method of the first embodiment described above with reference to FIG. 5, with one process for forming the yellow light emitting layer 373Y.

Note that, similar to the case of the above described first embodiment, an electronic apparatus which has the organic EL display 300 is included in the embodiments of the present disclosure.

3-2. Modified Example

A modified example of the above described third embodiment of the present disclosure will be described.

For example, as described above, the organic EL display 300 may be constituted by including other constituent elements, such as color filters or a protective layer, which are not shown in the figures. Note that in the case where the yellow light emitting layer 373Y is included such as in the present embodiment, since a three primary color display of red, green, and blue is set such as in the above described example, color filters for red and green may not be necessary. However, for example, if there is a case where a two primary color display of yellow and blue is set, the light of the yellow light emitting layer 373Y may be extracted as it is without including a color filter.

Further, while the blue light emitting layer 373B is formed by transfer in the above described example, the blue light emitting layer 373B may be formed by diffusion or the like as a common layer, such as the blue light emitting layer 273B of the second embodiment.

Note that, besides this, it is possible for each configuration described as modified examples of the above described first embodiment and the second embodiment to be applied to the present embodiment.

4. Supplement

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A display device including:

a step forming member which forms a step between a first region and a second region over a substrate so that the first region becomes higher than the second region when viewed from the substrate;

a first light emitting layer transferred to the first region; and a second light emitting layer transferred to the first region and the second region, and which has an emission wavelength shorter than an emission wavelength of the first light emitting layer.

(2)

The display device according to (1), wherein the step forming member further forms a step between the second region and a third region over the substrate so that the second region becomes higher than the third region when viewed from the substrate, and wherein the display device further includes a third light emitting layer formed in at least the third region, and which has an emission wavelength shorter than the emission wavelength of the second light emitting layer.

(3)

The display device according to (2), wherein the third light emitting layer is formed in the first region, the second region, and the third region.

(4)

The display device according to (3), wherein the third light emitting layer is transferred to the first region, the second region, and the third region.

(5)

The display device according to any one of (1) to (4), wherein the step forming member is a flattening insulating film provided between the substrate and the first light emitting layer and the second light emitting layer.

(6)

The display device according to (5), wherein the step is formed in a manner that a thickness of the flattening insulating film in the first region is greater than a thickness of the flattening insulating film in the second region.

(7)

The display device according to any one of (1) to (4), wherein the step forming member is a first color filter provided between the substrate and the first light emitting layer, and a second color filter provided between the substrate and the second light emitting layer, and wherein the step is formed in a manner that a thickness of the first color filter is greater than a thickness of the second color filter.

(8)

The display device according to any one of (1) to (4), wherein the step forming member is a color filter provided between the substrate and the first light emitting layer.

(9)

The display device according to any one of (1) to (4), wherein the step forming member is a thin film transistor layer provided between the substrate and the first light emitting layer and the second light emitting layer, and wherein the step is formed by an unevenness of a surface of the thin film transistor layer.

(10)

The display device according to any one of (1) to (9), wherein a height of the step is $1/100$ or more of a width of the second region, or is 500 nanometers or more.

(11)

The display device according to any one of (1) to (10), further including: a pair of electrode layers provided so that the superimposed first light emitting layer and the second light emitting layer are between the pair of electrode layers in the first region, wherein a thickness of the first light emitting layer and a thickness of the second light emitting layer are set so that an interval between the pair of electrode layers in the first region becomes an integral multiple of the emission wavelength of the first light emitting layer.

(12)

The display device according to (11), wherein the pair of electrode layers are provided so that the second light emitting layer is between the pair of electrode layers in the second region, and wherein the thickness of the second light emitting layer is set so that an interval between the pair of electrode layers in the second region becomes an integral multiple of the emission wavelength of the second light emitting layer.

(13)

A manufacturing method of a display device, the manufacturing method including: transferring a first light emitting layer applied uniformly on a transfer body to a first region over a substrate and preventing the first light emitting layer from adhering to a second region over the substrate by a step formed between the first region and the second region; and transferring a second light emitting layer having an emission wavelength shorter than an emission wavelength of the first light emitting layer to the first region and the second region.

(14)

The manufacturing method of a display device according to (13), wherein the second light emitting layer is applied uniformly on a transfer body and transferred to the first region and the second region, and wherein, at a time when the second light emitting layer is transferred, a contact pressure of the transfer body is adjusted so that the second light emitting layer is transferred to the second region.

(15)

The manufacturing method of a display device according to (13) or (14), wherein in the step for transferring the second light emitting layer, the second light emitting layer is prevented from adhering to a third region over the substrate by a step formed between the second region and the third region.

(16)

The manufacturing method of a display device according to (15), further including: forming a third light emitting layer in the first region, the second region, and the third region.

(17)

The manufacturing method of a display device according to (16), wherein the third light emitting layer is formed by being applied uniformly on a transfer body and transferred to the first region, the second region, and the third region.

(18)

An electronic apparatus including:

a display device including a step forming member which forms a step between a first region and a second region over a substrate so that the first region becomes higher than the second region when viewed from the substrate;

a first light emitting layer transferred to the first region; and a second light emitting layer transferred to the first region and the second region, and which has an emission wavelength shorter than an emission wavelength of the first light emitting layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

100, 200, 300 Display device (Organic EL display)
11 Substrate
12 Color filters
13 TFT layer
14 Flattening insulating film
15 Lower electrodes
16 Aperture insulating film
17, 27, 37 Organic layers
171 Hole injection layer (HIL)
172 Hole transport layer (HTL)
173, 273, 373 Light emitting layers (EML)
174 Electron transport layer (ETL)
175 Electron injection layer (EIL)
18 Upper electrode
21 Sealing substrate
41 Blanket
1000 Electronic apparatus

The invention claimed is:

1. A display device comprising:
a step forming member which forms a step between a first region and a second region over a substrate so that the first region becomes higher than the second region when viewed from the substrate;
a first light emitting layer transferred to the first region; and
a second light emitting layer transferred to the first region and the second region, and which has an emission wavelength shorter than an emission wavelength of the first light emitting layer,
wherein the step forming member includes a color filter provided between the substrate and the first light emitting layer,
wherein the step forming member includes a first color filter provided between the substrate and the first light emitting layer, and a second color filter provided between the substrate and the second light emitting layer, and
wherein the step forming member is formed in a manner that a thickness of the first color filter is greater than a thickness of the second color filter.

2. The display device according to claim 1,
wherein the step forming member further forms a step between the second region and a third region over the substrate so that the second region becomes higher than the third region when viewed from the substrate, and
wherein the display device further includes a third light emitting layer formed in at least the third region, and which has an emission wavelength shorter than the emission wavelength of the second light emitting layer.

3. The display device according to claim 2,
wherein the third light emitting layer is formed in the first region, the second region, and the third region.

4. The display device according to claim 3,
wherein the third light emitting layer is transferred to the first region, the second region, and the third region.

5. The display device according to claim 1,
wherein the step forming member is a flattening insulating film provided between the substrate and the first light emitting layer and the second light emitting layer.

6. The display device according to claim 5,
wherein the step is formed in a manner that a thickness of the flattening insulating film in the first region is greater than a thickness of the flattening insulating film in the second region.

7. The display device according to claim 1,
wherein the step forming member includes a thin film transistor layer provided between the substrate and the first light emitting layer and the second light emitting layer, and
wherein the step forming member is formed by an unevenness of a surface of the thin film transistor layer.

8. The display device according to claim 1,
wherein a height of the step forming member is 1/100 or more of a width of the second region, or is 500 nanometers or more.

9. The display device according to claim 1, further comprising: a pair of electrode layers provided so that the superimposed first light emitting layer and the second light emitting layer are between the pair of electrode layers in the first region,
wherein a thickness of the first light emitting layer and a thickness of the second light emitting layer are set so that an interval between the pair of electrode layers in the first region becomes an integral multiple of the emission wavelength of the first light emitting layer.

10. The display device according to claim 9,
wherein the pair of electrode layers are provided so that the second light emitting layer is between the pair of electrode layers in the second region, and
wherein the thickness of the second light emitting layer is set so that an interval between the pair of electrode layers in the second region becomes an integral multiple of the emission wavelength of the second light emitting layer.

11. A manufacturing method of a display device, the manufacturing method comprising:
transferring a first light emitting layer applied uniformly on a transfer body to a first region over a substrate and preventing the first light emitting layer from adhering to a second region over the substrate by a step formed between the first region and the second region; and
transferring a second light emitting layer having an emission wavelength shorter than an emission wavelength of the first light emitting layer to the first region and the second region.

12. The manufacturing method of a display device according to claim 11,
wherein the second light emitting layer is applied uniformly on a transfer body and transferred to the first region and the second region, and
wherein, at a time when the second light emitting layer is transferred, a contact pressure of the transfer body is adjusted so that the second light emitting layer is transferred to the second region.

13. The manufacturing method of a display device according to claim 11,
wherein in the step for transferring the second light emitting layer, the second light emitting layer is prevented from adhering to a third region over the substrate by a step formed between the second region and the third region.

14. The manufacturing method of a display device according to claim 13, further comprising: forming a third light emitting layer in the first region, the second region, and the third region.

15. The manufacturing method of a display device according to claim 14, wherein the third light emitting layer is formed by being applied uniformly on a transfer body and transferred to the first region, the second region, and the third region.

16. An electronic apparatus comprising:
a display device including
- a step forming member which forms a step between a first region and a second region over a substrate so that the first region becomes higher than the second region when viewed from the substrate;
- a first light emitting layer transferred to the first region; and
- a second light emitting layer transferred to the first region and the second region, and which has an emission wavelength shorter than an emission wavelength of the first light emitting layer,
- wherein the step forming member includes a color filter provided between the substrate and the first light emitting layer,
- wherein the step forming member includes a first color filter provided between the substrate and the first light emitting layer, and a second color filter provided between the substrate and the second light emitting layer, and
- wherein the step forming member is formed in a manner that a thickness of the first color filter is greater than a thickness of the second color filter.

17. A display device comprising:
a step forming member which forms a step between a first region and a second region over a substrate so that the first region becomes higher than the second region when viewed from the substrate;
a first light emitting layer transferred to the first region; and
a second light emitting layer transferred to the first region and the second region, and which has an emission wavelength shorter than an emission wavelength of the first light emitting layer,
wherein the step forming member includes a first color filter provided between the substrate and the first light emitting layer, and a second color filter provided between the substrate and the second light emitting layer, and
wherein the step forming member is formed in a manner that a thickness of the first color filter is greater than a thickness of the second color filter.

18. A display device comprising:
a step forming member which forms a step between a first region and a second region over a substrate so that the first region becomes higher than the second region when viewed from the substrate;
a first light emitting layer transferred to the first region; and
a second light emitting layer transferred to the first region and the second region, and which has an emission wavelength shorter than an emission wavelength of the first light emitting layer,
wherein the step forming member includes a thin film transistor layer provided between the substrate and the first light emitting layer and the second light emitting layer, and
wherein the step forming member is formed by an unevenness of a surface of the thin film transistor layer.

19. A display device comprising:
a step forming member which forms a step between a first region and a second region over a substrate so that the first region becomes higher than the second region when viewed from the substrate;
a first light emitting layer transferred to the first region; and
a second light emitting layer transferred to the first region and the second region, and which has an emission wavelength shorter than an emission wavelength of the first light emitting layer,
wherein the step forming member includes a color filter provided between the substrate and the first light emitting layer,
wherein the step forming member includes a thin film transistor layer provided between the substrate and the first light emitting layer and the second light emitting layer, and
wherein the step forming member is formed by an unevenness of a surface of the thin film transistor layer.

20. An electronic apparatus comprising:
a display device including
- a step forming member which forms a step between a first region and a second region over a substrate so that the first region becomes higher than the second region when viewed from the substrate;
- a first light emitting layer transferred to the first region; and
- a second light emitting layer transferred to the first region and the second region, and which has an emission wavelength shorter than an emission wavelength of the first light emitting layer,
- wherein the step forming member includes a color filter provided between the substrate and the first light emitting layer,
- wherein the step forming member includes a thin film transistor layer provided between the substrate and the first light emitting layer and the second light emitting layer, and
- wherein the step forming member is formed by an unevenness of a surface of the thin film transistor layer.

* * * * *